(12) United States Patent
Sato et al.

(10) Patent No.: US 10,241,414 B2
(45) Date of Patent: Mar. 26, 2019

(54) IMAGE FORMING DEVICE AND DOT PATTERN DETERMINING METHOD

(71) Applicant: SEIKO EPSON CORPORATION, Tokyo (JP)

(72) Inventors: Akito Sato, Nagano (JP); Naoki Sudo, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/876,536

(22) Filed: Jan. 22, 2018

(65) Prior Publication Data

US 2018/0143538 A1    May 24, 2018

Related U.S. Application Data

(63) Continuation of application No. 14/601,929, filed on Jan. 21, 2015, now Pat. No. 9,927,710.

(51) Int. Cl.
*B41J 2/165* (2006.01)
*G03F 7/20* (2006.01)
*B41J 2/21* (2006.01)

(52) U.S. Cl.
CPC ........ *G03F 7/70141* (2013.01); *B41J 2/2139* (2013.01); *B41J 2/2146* (2013.01)

(58) Field of Classification Search
None
See application file for complete search history.

(56) References Cited

U.S. PATENT DOCUMENTS

| | | | |
|---|---|---|---|
| 6,481,816 B1 | 11/2002 | Oyen | |
| 6,575,549 B1 | 6/2003 | Silverbrook | |
| 7,192,112 B2 | 3/2007 | Nakanishi et al. | |
| 2004/0119766 A1* | 6/2004 | Shibata | B41J 2/2139 347/12 |
| 2005/0073546 A1 | 4/2005 | Kuwahara et al. | |
| 2006/0262155 A1 | 11/2006 | Kuwahara et al. | |
| 2013/0278658 A1 | 10/2013 | Metcalfe et al. | |

FOREIGN PATENT DOCUMENTS

| | | |
|---|---|---|
| JP | 2004-122521 A | 4/2004 |
| JP | 2005-074944 A | 3/2005 |
| JP | 2008-273014 A | 11/2008 |
| JP | 2013-224027 A | 10/2013 |

* cited by examiner

*Primary Examiner* — Alejandro Valencia

(57) ABSTRACT

An image forming device in which a plurality of nozzles are aligned in a designated alignment direction, wherein a plurality of pixels constituting a formed image includes dot omission pixels continuous in a scan direction by a defective nozzle included in the plurality of nozzles, and neighboring pixels within a designated distance in the alignment direction from the dot omission pixels, the image forming device comprising a pattern determining unit configured to determine a dot pattern after supplementation formed on neighboring pixels within designated range based on at least the number of dots to be formed on the pixels within the designated range including a portion of the dot omission pixels and a portion of the neighboring pixels according to recording data before supplementation of dots by the defective nozzle, and a pattern forming unit configured to form the dot pattern after supplementation.

16 Claims, 20 Drawing Sheets

WHEN Nsum ≤ 3
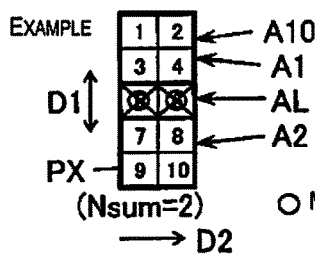 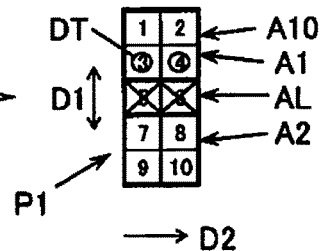
WHEN 4 ≤ Nsum ≤ 6
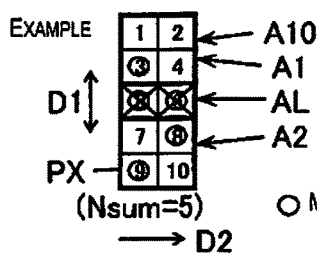 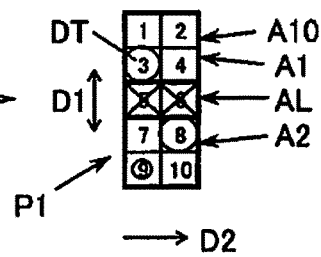
WHEN 7 ≤ Nsum ≤ 8
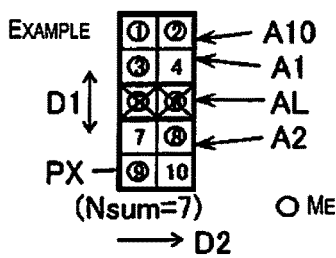 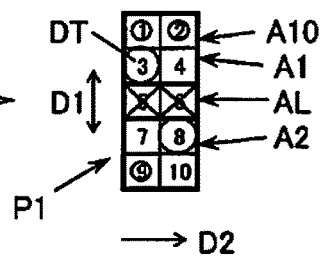
WHEN 9 ≤ Nsum
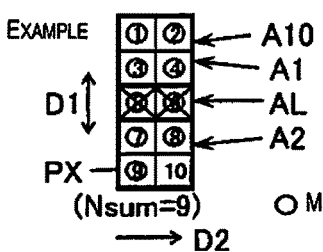 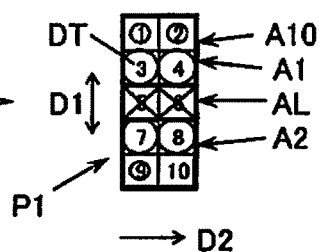
Fig. 1

TBL2 (LOW INK VOLUME)

NOZZLE — PIXEL
- RN3 — PX3 (A1)
- RN1 — PX1
- LN — PXL
- RN2 — PX2 (A2)
- RN4 — PX4

AL
(N2=0)

(Nsum ≤ 3)

0: No Dots
M: Medium Dots Formed
L: Large Dots Formed

RN1 REPLACEMENT

| LN | | RN1 | | → | REPLACEMENT | |
|---|---|---|---|---|---|---|
| M | M | M | 0 | → | L | M | ~ 813 |
| M | M | 0 | M | → | L | M | ~ 814 |
| M | M | 0 | 0 | → | M | M | ~ 815 |
| M | 0 | M | M | → | L | M | |
| M | 0 | M | 0 | → | M | 0 | |
| M | 0 | 0 | M | → | M | M | |
| M | 0 | 0 | 0 | → | M | 0 | 812 |
| 0 | M | M | M | → | L | M | |
| 0 | M | M | 0 | → | M | M | |
| 0 | M | 0 | M | → | 0 | M | |
| 0 | M | 0 | 0 | → | 0 | M | |

No RN3 REPLACEMENT

RN2 REPLACEMENT

| LN | | RN2 | | → | REPLACEMENT | |
|---|---|---|---|---|---|---|
| M | M | 0 | 0 | → | 0 | 0 | ~ 816 |
| M | 0 | 0 | 0 | → | 0 | 0 | 811 |
| 0 | M | 0 | 0 | → | 0 | 0 | |

No RN4 REPLACEMENT

{ WHEN A 1 DOT RULED LINE, FORM SUPPLEMENTATION DOTS IN A1 }

{ FOR OTHER THAN A RULED LINE, FORM SUPPLEMENTATION DOTS IN A1 HAVING DOTS }

Fig. 11

TBL6 (High Ink Volume)

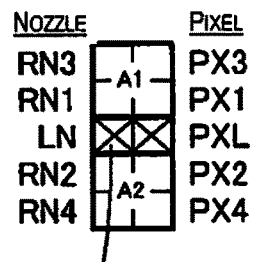

Nozzle / Pixel: RN3-PX3, RN1-PX1, LN-PXL, RN2-PX2, RN4-PX4, AL (7 ≤ Nsum ≤ 8)

0: No Dots
S: Small Dots Formed
M: Medium Dots Formed
L: Large Dots Formed

RN1 Replacement

| LN | RN1 | | | → | Replacement | |
|---|---|---|---|---|---|---|
| M | M | M | M | → | L | M |
| M | M | M | 0 | → | L | M |
| M | M | 0 | M | → | L | M |
| M | M | 0 | 0 | → | M | M |
| M | 0 | M | M | → | L | M |
| M | 0 | M | 0 | → | L | 0 |
| M | 0 | 0 | M | → | M | M |
| M | 0 | 0 | 0 | → | M | 0 |
| 0 | M | M | M | → | L | M |
| 0 | M | M | 0 | → | M | M |
| 0 | M | 0 | M | → | L | 0 |
| 0 | M | 0 | 0 | → | 0 | M |

RN3 Replacement — A Portion Replaced With 0 Or S

~831, ~831, ~833, ~831, ~831, ~833

RN2 Replacement

| LN | RN2 | | | → | Replacement | |
|---|---|---|---|---|---|---|
| M | M | M | M | → | L | M |
| M | M | M | 0 | → | L | M |
| M | M | 0 | M | → | L | M |
| M | M | 0 | 0 | → | M | M |
| M | 0 | M | M | → | L | M |
| M | 0 | M | 0 | → | L | 0 |
| M | 0 | 0 | M | → | M | M |
| M | 0 | 0 | 0 | → | M | 0 |
| 0 | M | M | M | → | L | M |
| 0 | M | M | 0 | → | M | M |
| 0 | M | 0 | M | → | L | 0 |
| 0 | M | 0 | 0 | → | 0 | M |

RN4 Replacement — A Portion Replaced With 0 Or S

~832, ~832, ~834, ~832, ~832, ~834

{ Enlarge Dots Of Primary Neighboring Pixel }

{ Cull Or Make Smaller Dots Of Secondary Neighboring Pixel }

Fig. 13

TBL7 (High Ink Volume)

| Nozzle | Pixel |
|---|---|
| RN3 | PX3 |
| RN1 | PX1 |
| LN | PXL |
| RN2 | PX2 |
| RN4 | PX4 |

AL (9 ≤ Nsum)

0: No Dots
M: Medium Dots Formed
L: Large Dots Formed

RN1 Replacement — No RN3 Replacement

| LN | RN1 | → | Replacement | |
|---|---|---|---|---|
| M M | M M | → | L M | ~ 841 |
| M M | M 0 | → | L M | ~ 841 |
| M M | 0 M | → | L M | ~ 843 |
| M M | 0 0 | → | M M | |
| M 0 | M M | → | L M | ~ 841 |
| M 0 | M 0 | → | L 0 | ~ 841 |
| M 0 | 0 M | → | M M | |
| M 0 | 0 0 | → | M 0 | |
| 0 M | M M | → | L M | ~ 841 |
| 0 M | M 0 | → | M M | |
| 0 M | 0 M | → | L 0 | ~ 843 |
| 0 M | 0 0 | → | 0 M | |

RN2 Replacement — No RN4 Replacement

| LN | RN2 | → | Replacement | |
|---|---|---|---|---|
| M M | M M | → | L M | ~ 842 |
| M M | M 0 | → | L M | ~ 842 |
| M M | 0 M | → | L M | ~ 844 |
| M M | 0 0 | → | M M | |
| M 0 | M M | → | L M | ~ 842 |
| M 0 | M 0 | → | L 0 | ~ 842 |
| M 0 | 0 M | → | M M | |
| M 0 | 0 0 | → | M 0 | |
| 0 M | M M | → | L M | ~ 842 |
| 0 M | M 0 | → | M M | |
| 0 M | 0 M | → | L 0 | ~ 844 |
| 0 M | 0 0 | → | 0 M | |

{ Enlarge Dots Of Primary Neighboring Pixel }

{ Maintain Size Of Dots Of Secondary Neighboring Pixel }

Fig. 14

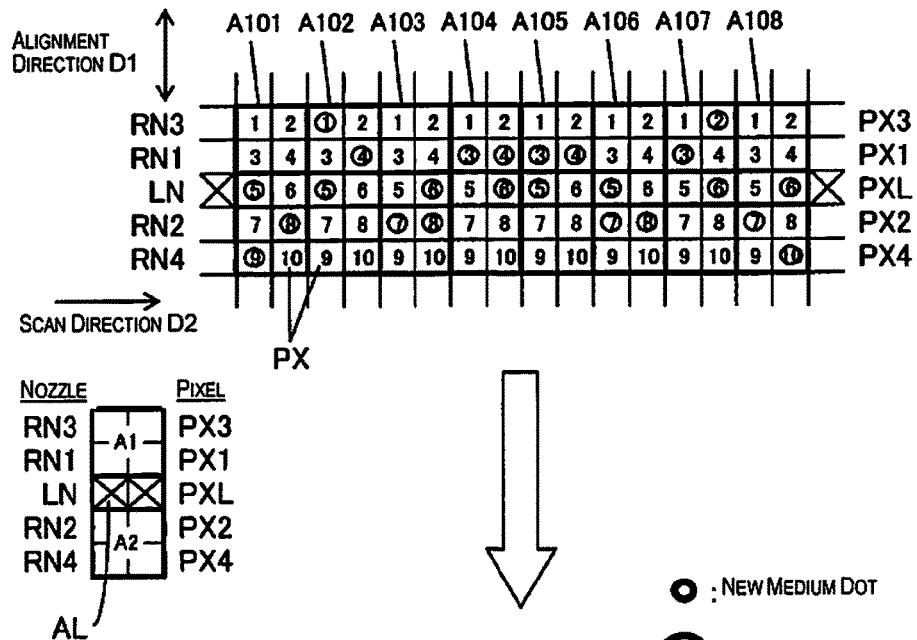
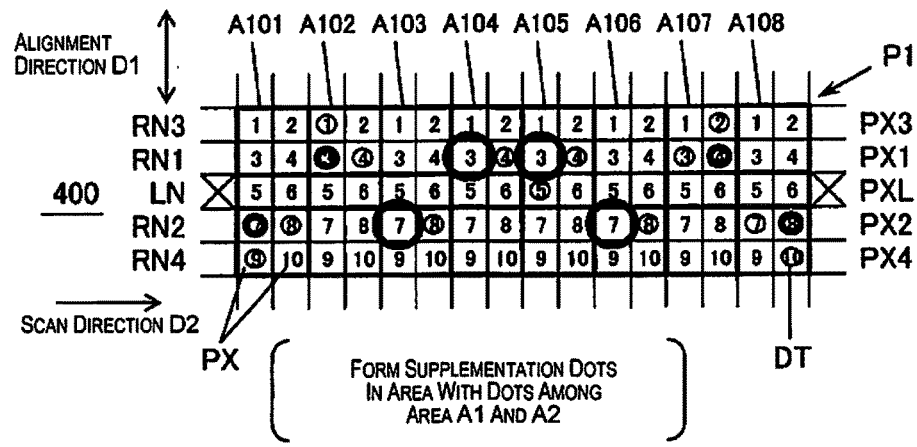
Fig. 15

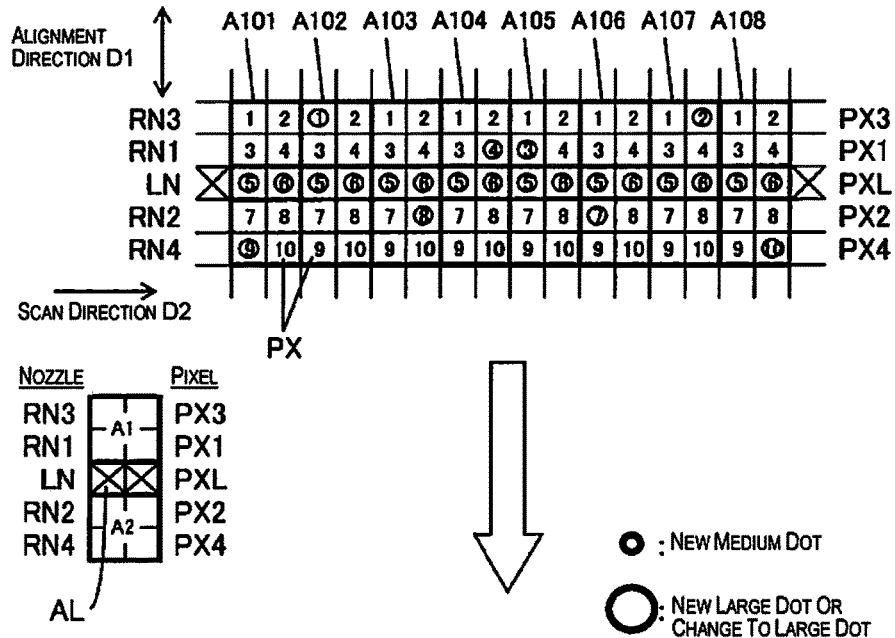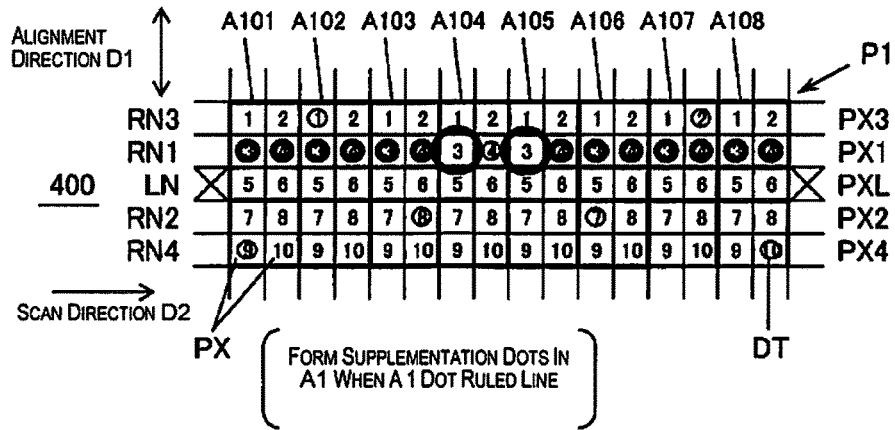
Fig. 16

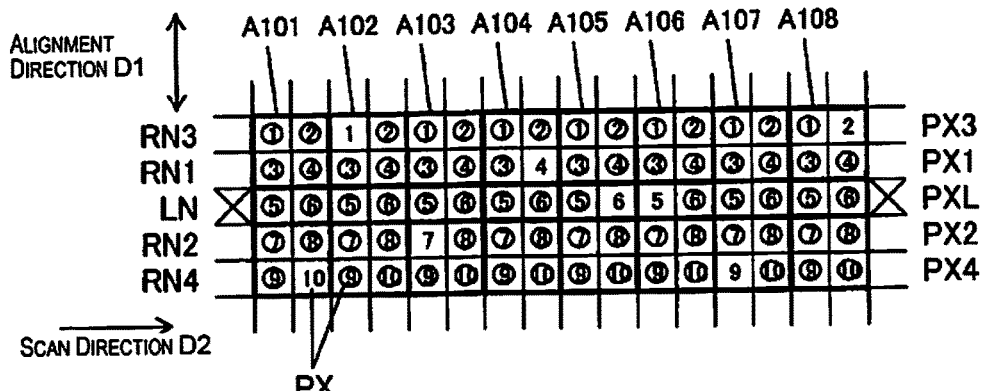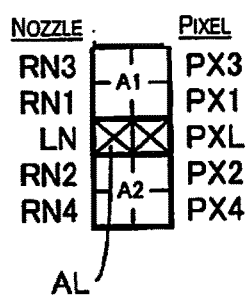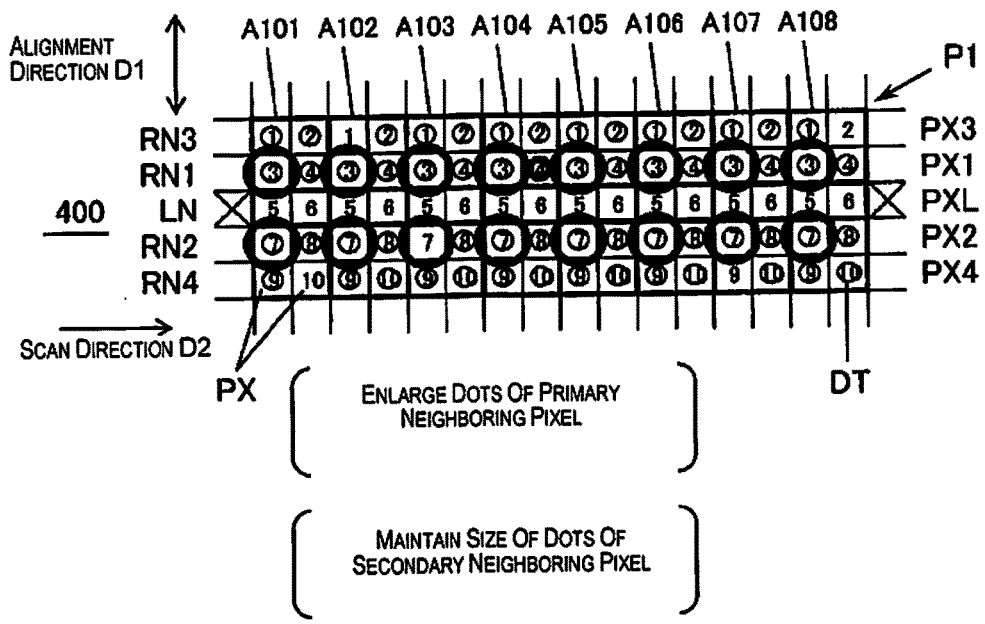
Fig. 17

Fig. 20

IMAGE FORMING DEVICE AND DOT PATTERN DETERMINING METHOD

CROSS-REFERENCE TO RELATED APPLICATIONS

This is a continuation application of U.S. patent application Ser. No. 14/601,929, which claims priority to Japanese Patent Application No. 2014-018299 filed on Feb. 3, 2014. The entire disclosures of U.S. patent application Ser. No. 14/601,929 and Japanese Patent Application No. 2014-018299 are hereby incorporated herein by reference.

BACKGROUND

Technical Field

The present invention relates to an image forming device and a dot pattern determining method.

Related Art

With inkjet printers, for example, a plurality of nozzles aligned in a designated nozzle alignment direction and an object to be printed (object to be recorded) are moved relative to each other in a scan direction orthogonal to the nozzle alignment direction, ink droplets (liquid droplets) are discharged from nozzles according to recording data expressing the presence or absence of dots for each pixel, and dots are formed on the object to be printed. When ink droplets are not discharged from the nozzles or the discharged ink droplets do not draw the correct trajectory due to a clog or the like, "missing dot" areas for which pixels for which dots are not formed are formed connected in the scan direction, and streaks called white streaks occur on the print image. With the technology noted in JP-A-2005-74944 (patent document 1), the supplementation locations of dots to be printed by ink discharge-defective nozzles for which the dot formation is defective are determined according to priority sequence, and ink droplets are discharged from peripheral nozzles so as to form dots in the determined supplementation locations.

SUMMARY

In images expressed by recording data, there are parts with low dot density and parts with high dot density. With the technology described above, the location of the supplementation dots are determined simply according to priority sequence, so compared to an image expressed by the original recording data, when viewing the print image, it may feel dense or it may feel thin or the like, so there is a feeling that the dot supplementation is unsuitable. Also, when the original recording data is data for which ruled lines facing the scan direction are formed by the ink discharge-defective nozzles, there are cases when, of the first and second adjacent areas sandwiching the "missing dot" area in the nozzle alignment direction, the supplementation dots are formed in the first adjacent area, and cases when supplementation dots are formed in the second adjacent area. In this case, the printing image quality is decreased due to double lines not expressed in the original recording data being formed.

The kind of problem noted above is not limited to when forming ruled lines, and is not limited to inkjet printers, but in fact the same situation also exists for various technologies.

Considering the above, one aspect is to provide technology which makes it possible to more suitably supplement dots by defective nozzles for which dot formation is defective.

To achieve one of the aspects noted above, the present invention has a mode as an image forming device in which a plurality of nozzles aligned in a designated alignment direction and an object to be recorded are moved relative to each other in a scan direction different from the alignment direction, wherein a plurality of pixels constituting a formed image includes dot omission pixels continuous in the scan direction by a defective nozzle included in the plurality of nozzles, and neighboring pixels within a designated distance in the alignment direction from the dot omission pixels, the image forming device comprising: a pattern determining unit configured to determine a dot pattern after supplementation formed on neighboring pixels within the designated range based on at least the number of dots to be formed on the pixels within the designated range including a portion of the dot omission pixels and a portion of the neighboring pixels according to recording data before supplementation of dots by the defective nozzle, and a pattern forming unit configured to form the dot pattern after supplementation.

Also, the present invention has a mode as a dot pattern determining method for an image forming device in which a plurality of nozzles aligned in a designated alignment direction and an object to be recorded are moved relative to each other in a scan direction different from the alignment direction, wherein a plurality of pixels constituting a formed image includes dot omission pixels continuous in the scan direction by defective nozzles included in the plurality of nozzles, and neighboring pixels within a designated distance in the alignment direction from the dot omission pixels, the dot pattern determining method comprising: determining a dot pattern after supplementation formed on neighboring pixels within the designated range based on at least the number of dots to be formed on the pixels within the designated range including a portion of the dot omission pixels and a portion of the neighboring pixels according to recording data before supplementation of dots by the defective nozzle.

Specifically, the dot pattern after supplementation for forming on neighboring pixels within a designated range are formed based upon at least the number of dots to be formed on the dot omission pixels and neighboring pixels in a designated range when according to the recording data before supplementation of dots by the defective nozzle. Therefore, with this technology, it is possible to provide technology capable of more suitably supplementing dots by defective nozzles for which dot formation is defective.

Furthermore, the present invention can also be used for a device such as a printing device including an image forming device, an image forming method such as a printing method including a dot pattern determining method, an image forming program that realizes on a computer functions corresponding to each part described above, a program such as a printing program including this image forming program, a medium that can be read by a computer on which these programs are recorded, and the like. The above-mentioned device can be separately configured by a plurality of component.

BRIEF DESCRIPTION OF THE DRAWINGS

Referring now to the attached drawings which form a part of this original disclosure:

FIG. 1 is a drawing schematically showing an example of determining a dot pattern P1 after supplementation based on a number Nsum of dots to be formed in pixels PX within a designated range A10;

FIG. 11 is a drawing schematically showing an example of the structure of the low ink volume pattern table TBL2;

FIG. 13 is a drawing schematically showing an example of the structure of the high ink volume pattern table TBL6;

FIG. 14 is a drawing schematically showing an example of the structure of the high ink volume pattern table TBL7;

FIG. 15 is a drawing schematically showing an example of the dot pattern P1 formed on a low ink volume image when a one-dot ruled line is not formed on the dot omission pixels PXL;

FIG. 16 is a drawing schematically showing an example of the dot pattern P1 formed on a low ink volume image when a one-dot ruled line is formed on the dot omission pixels PXL;

FIG. 17 is a drawing schematically showing an example of the dot pattern P1 formed on a high ink volume image;

FIG. 20 is a drawing schematically showing an example of a dot pattern with supplementation dots dispersed in areas A1 and A2 when a one-dot ruled line is formed on the dot omission pixels PXL.

DETAILED DESCRIPTION OF EMBODIMENTS

Figure 2:
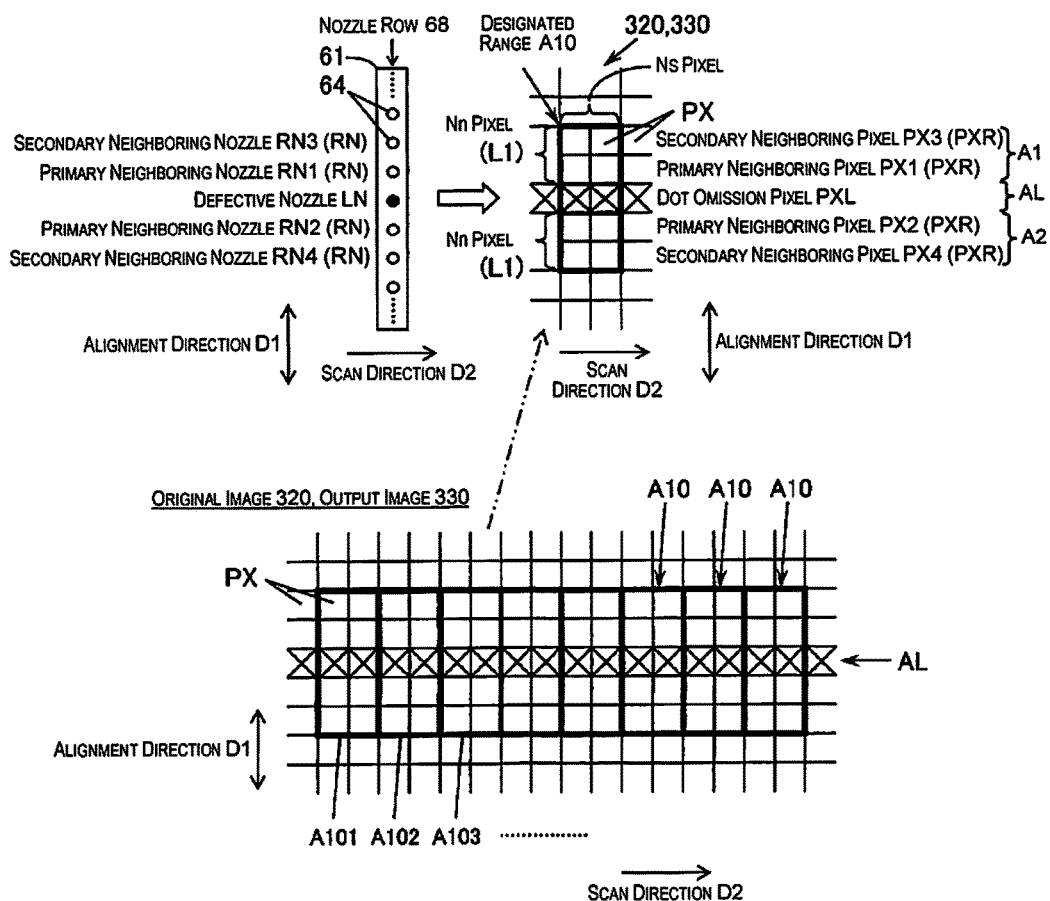
FIG. 2 is a drawing schematically showing an example of the correlation between nozzles 64 and pixels PX.

Following, we will describe embodiments of the present invention. Of course, the embodiments below are nothing more than examples of the present invention, and all of the characteristics shown in the embodiments are not necessarily essential as means of solving of the invention.

(1) Summary of the Technology:

First, we will describe a summary of this technology while referring to FIGS. 1 through 19.

A plurality of nozzles 64 of this technology are aligned in a designated alignment direction D1. When a plurality of nozzle rows 68 are provided, the plurality of nozzles 64 means the plurality of nozzles 64 aligned in the alignment direction D1 contained in each nozzle row 68. This kind of plurality of nozzles 64 and an object to be recorded 400 are moved relative to each other in a scan direction D2 which is different from the alignment direction D1. The nozzles 64 and the object to be recorded 400 moving relative to each other includes the nozzles 64 not moving while the object to be recorded 400 is moved in the scan direction D2 as with a line printer, the object to be recorded 400 not moving while the nozzles 64 move in the scan direction D2, and both the nozzles 64 and the object to be recorded 400 moving in the scan direction D2. A plurality of pixels PX constituting a formed image 330 includes dot omission pixels PXL continuous in the scan direction D2 by defective nozzles LN included in the plurality of nozzles 64, and neighboring pixels PXR within a designated distance L1 in the alignment direction D1 from the dot omission pixels PXL. A pattern determining unit U1 of this image forming device 1 determines a pattern P1 of dots DT after supplementation for forming neighboring pixels PXR within the designated range A10 based on at least the number Nsum of dots DT to be formed on pixels PX within the designated range A10 including a portion of the dot omission pixels PXL and a portion of the neighboring pixels PXR when according to the recording data 300 before supplementation of the dots DT by the defective nozzles LN. A pattern forming unit U2 of this image forming device 1 forms the pattern P1 of dots DT after supplementation. Therefore, dots DT by the defective nozzles LN for which dot DT formation is defective are more suitably supplemented.

Here, in addition to forming the dot pattern P1 on the object to be recorded 400, forming the dot pattern P1 includes forming the dot pattern P1 on other than the object to be recorded 400 such as displaying the dot pattern P1.

The designated range A10 can also include a first area A1 and a second area A2 sandwiching the dot omission pixels PXL in the alignment direction D1. For example, when the size of the designated range A10 in the scan direction D2 is 2 pixels (there are two pixels for the dot omission pixels PXL), it is possible to do more suitable dot supplementation than when there is one pixel, and possible to do supplementation more quickly than when there are three pixels, so it is possible to efficiently and suitably supplement the dots DT by the defective nozzles LN. Also, when the size of at least one of the first area A1 and the second area A2 in the alignment direction D1 is two pixels, it is possible to more suitably do dot supplementation than with one pixel, and possible to do dot supplementation more quickly then when with three pixels, so it is possible to efficiently and suitably supplement dots DT by the defective nozzles LN.

The pattern determining unit U1 can also determine the pattern P1 of the dots DT after supplementation based on at least the number Nsum of dots, and the number Nln of dots DT to be formed on the dot omission pixels PXL within the designated range A10 when according to the recording data 300. In this mode, the number Nln of dots by the defective nozzles LN is reflected in the dot pattern P1 after supplementation, so it is possible to even more suitably supplement the dots DT by the defective nozzles LN.

The pattern determining unit U1 can also determine the pattern P1 of the dots DT after supplementation based on at least the number Nsum of dots, the number N1 of dots DT to be formed on the pixels PX of the first area A1 when according to the recording data 300, and the number N2 of dots DT to be formed on the pixels PX of the second area A2 when according to the recording data 300. In this mode, the dot counts N1 and N2 respectively of the first area A1 and the second area A2 in the vicinity of the dot omission area AL are reflected in the dot pattern P1 after supplementation, so it is possible to even more suitably supplement the dots DT by the defective nozzles LN.

The pattern determining unit U1 can also arrange all the dots DT to be supplemented in the pixels PX of one or the other of the first area A1 and the second area A2 when the number of dots Nsum is a designated number T1 or less, and the dots DT to be formed on the dot omission pixels PXL within the designated range A10 when according to the recording data 300 are continuous in the scan direction D2. In this kind of case, it is possible that the dot DT density within the designated range A10 is low, and that ruled lines are formed only in the dot omission area AL when according to the recording data 300, so by arranging all the dots DT to be supplemented in the pixels PX of one or the other of the first area A1 and the second area A2, double line formation due to dot supplementation is suppressed. In particular, by applying the determined dot pattern P1 continuously in the scan direction D2, double line formation due to dot supplementation is more reliably suppressed. Therefore, with this mode, it is possible to suppress double line formation due to dot supplementation and to even more suitably do dot supplementation.

The pattern determining unit U1 can also arrange the dots DT supplemented to the pixels PX in, of the first area A1 and the second area A2, the area of the larger item between the dot count N1 formed in the pixels of the first area when according to the recording data, and the dot count N2 formed in the pixels of the second area when according to the recording data. With this mode, it is possible to more suitably do dot supplementation by having the dots DT concentrated in the area with a greater dot count in the vicinity of the dot omission area AL.

It is also possible to include in the pattern P1 of dots DT after supplementation dots DT for which the size has been changed. With this mode, it is possible to even more suitably do dot supplementation by improving the degree of freedom of the dot pattern P1.

This image forming device 1 can also be equipped with a pattern storage unit U3 in which is stored a plurality of pattern tables TBLi (examples shown in FIGS. 10 to 14) in which are housed information expressing the pattern P1 of dots DT after supplementation. The pattern tables TBLi can house information correlating to a number Nsum of the dots DT to be formed on the dot omission pixels PXL and the neighboring pixels PXR within the designated range A10 when according to the recording data 300. The pattern determining unit U1 can also determine the pattern P1 of dots DT after the supplementation according to information stored in, among the plurality of pattern tables TBLi, the pattern table TBLi corresponding to the number Nsum when according to the recording data 300. With this mode, the dot supplementation process is performed quickly, and it is possible to efficiently and suitably supplement the dots DT by the defective nozzles LN.

The pattern determining unit U1, when the number of dots DT to be formed on the dot omission pixels PXL and the neighboring pixels PXR within the designated range A10 according to the recording data 300 is a second designated number T2 or greater, can make at least a portion of the dots DT forming the adjacent pixels (PX1, PX2) adjacent to the dot omission pixels PXL among the neighboring pixels PXR within the designated range A10 larger, and can maintain the size of the dots DT formed on the non-adjacent pixels (PX3, PX4) excluding the adjacent pixels (PX1, PX2) among the neighboring pixels PXR within the designated range A10. In this kind of case, because the density of the dots DT formed inside the designated range A10 is high, the streaks of the dot omission area AL stand out. By making at least a portion of the dots DT formed in the adjacent pixels (PX1, PX2) adjacent to the dot omission pixels PXL larger, and maintaining the size of the dots DT formed in the non-adjacent pixels (PX3, PX4) within the designated range A10, insufficient supplementation for which dot supplementation is insufficient is suppressed. Therefore, with this mode, it is possible to suppress insufficient supplementation and even more suitably do dot supplementation.

This image forming device 1 can also be equipped with a setting receiving unit U4 for receiving one of the settings among a plurality of settings including first settings for forming dots DT on a first object to be recorded 401 (e.g., glossy paper), and second settings for forming dots DT on a second object to be recorded 402 (e.g., recycled paper) for which liquid bleeds more easily than the first object to be recorded 401. The pattern determining unit U1, when the number of dots Nsum is a second designated number T2 or greater, can make the ratio for enlarging the dots DT to be formed on the neighboring pixels PXR within the designated range A10 when the first settings are received larger than the ratio for enlarging the dots DT to be formed on the neighboring pixels PXR within the designated range A10 when the second settings are received. In this kind of case, the density of the dots DT formed within the designated range A10 is high, so when the first object to be recorded 401 for which relatively small dots DT are formed is used, the streak of the dot omission area AL stands out. By making the ratio for enlarging the dots DT to be formed on the neighboring pixels PXR within the designated range A10 when using the first object to be recorded 401 larger than the ratio for enlarging the dots DT to be formed on the neighboring pixels PXR within the designated range A10 when using the second object to be recorded 402, the streak of the dot omission area AL when using the first object to be recorded 401 does not stand out easily. Therefore, with this mode, when the dot density is high, it is possible to more suitably supplement the dots DT by the defective nozzles LN according to how easily the liquid bleeds on the object to be recorded 400.

Figure 3:
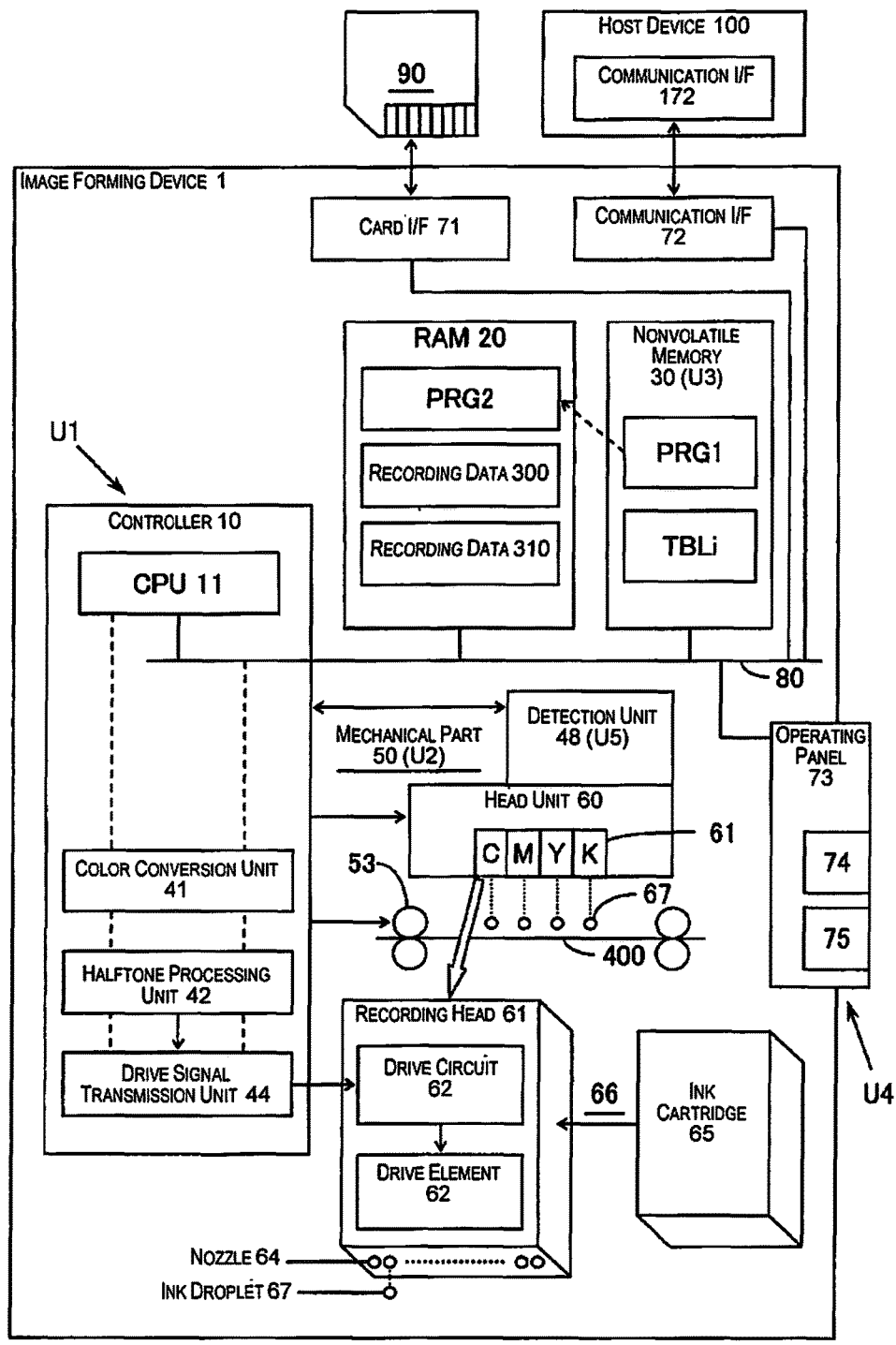
FIG. 3 is a drawing schematically showing a constitutional example of the image forming device 1.
Figure 4:
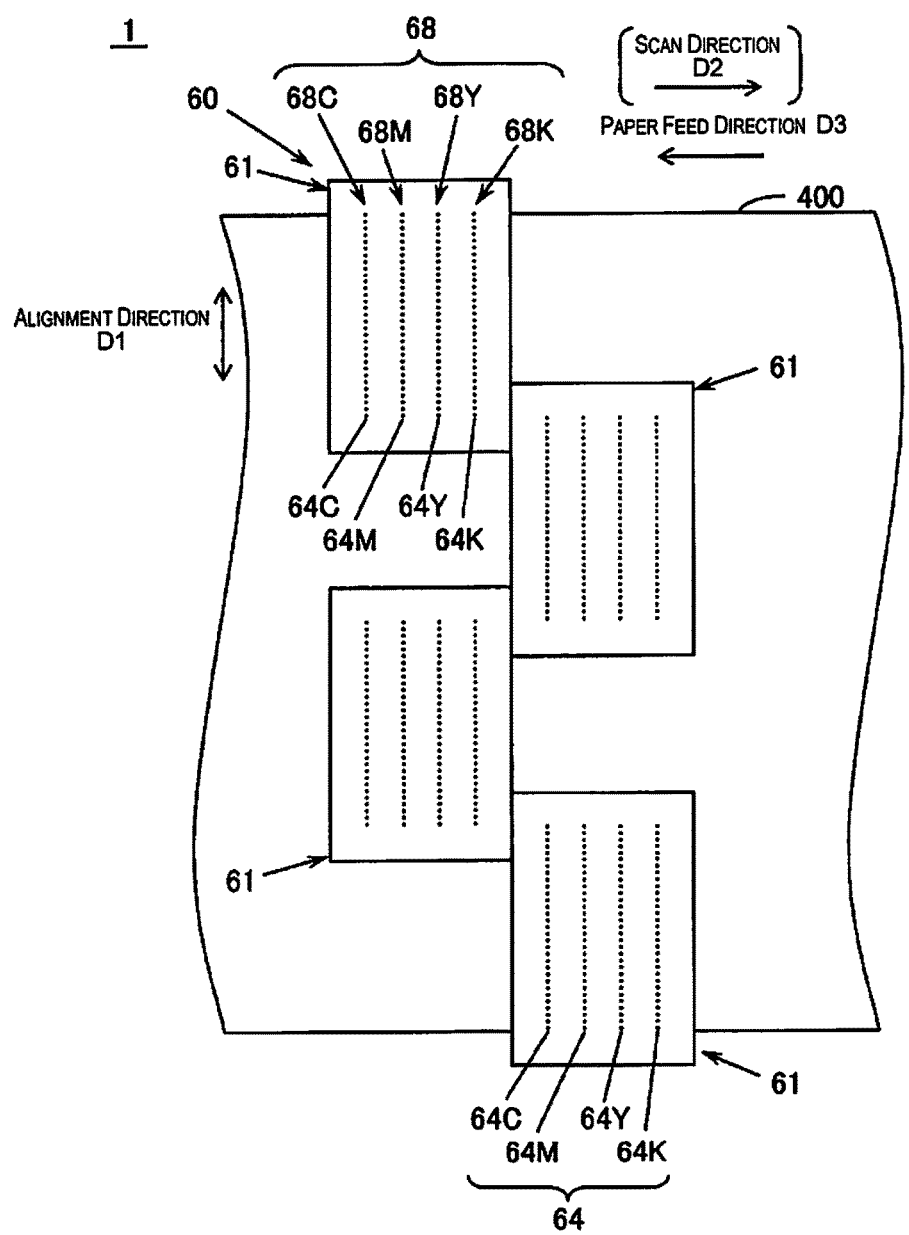
FIG. 4 is a drawing schematically showing an example of the key parts of a line printer as the image forming device 1.

(2) Constitution of the Image Forming Device:

FIG. 1 is a drawing schematically showing an example of determining a pattern P1 of dots DT after supplementation based on a number Nsum of dots DT to be formed in pixels PX within a designated range A10. FIG. 2 is a drawing schematically showing an example of the correlation between nozzles 64 and pixels PX. FIG. 3 is a drawing schematically showing a constitutional example of the image forming device 1. FIG. 4 is a drawing schematically showing an example of the key parts of a line printer as the image forming device 1. In these drawings, code number D1 indicates the alignment direction of the nozzles 64, code number D2 indicates the scan direction D2 of the recording head 61, and code number D3 indicates the paper feed direction opposite to the scan direction D2. The alignment direction D1 and the scan direction D2 (paper feed direction D3) are acceptable as long as they cross each other, and not only being orthogonal but also not being orthogonal is included in the present invention. Being orthogonal in the present invention includes not exactly being orthogonal with errors. To show this in an easy to understand manner, the enlargement ratio of each direction may differ, and the drawings may not match with each other.

The image forming device 1 generates recording data 310 expressing the output image 330 for which there has been supplementation of dots to be formed by the defective nozzles LN based on the recording data 300 expressing the original image 320 before dot supplementation. The images 320 and 330 before and after supplementation are multi-value or binary images expressing the presence or absence (status) of the formation of dots DT for the respective pixels PX aligned systematically with the respective alignment direction D1 and the scan direction D2. The output image 330 is an image actually formed on the object to be recorded 400, for example. The original image 320 is a virtual image that is not actually formed, because it is the image before dots are supplemented.

First, we will describe an example of the correlation of the nozzles 64 and the pixels PX. A head unit 60 shown in FIG. 4 is equipped with recording heads 61 having a C (cyan) nozzle row 68C, an M (magenta) nozzle row 68M, a Y (yellow) nozzle row 68Y, and a K (black) nozzle row 68K. The recording heads 61 can also be provided separately by colors CMYK. The nozzle rows 68C, 68M, 68Y, and 68K are aligned in the paper feed direction D3 of the object to be recorded 400 such as printing paper (one type of object to be printed). The head unit 60 is fixed so as not to move, so the scan direction D2 of the recording head 61 becomes a direction opposite to the paper feed direction D3. Each nozzle row 68C, 68M, 68Y, and 68K has nozzles 64C, 64M, 64Y, and 64K aligned in the alignment direction D1. This technology includes cases for which even with nozzle rows for which the nozzles are arranged in zigzag form, the plurality of nozzles are aligned for example in two rows in a designated alignment direction different from the scan direction. The alignment direction in this case means the direction in which the nozzles are aligned for each row with the zigzag arrangement.

The head unit 60 shown in FIG. 4 has a plurality of recording heads 61 arranged to be able to form dots DT on the object to be recorded 400 using ink droplets (liquid droplets) 67 discharged (sprayed) from the nozzles 64C, 64M, 64Y, and 64K across the entire width direction of the object to be recorded 400 (alignment direction D1). Here, the nozzle rows 68C, 68M, 68Y, and 68K are collectively named nozzle row 68, and the nozzles 64C, 64M, 64Y, and 64K are collectively named nozzles 64.

There are cases when defective nozzles LN occur in the nozzle row 68 when ink droplets are not discharged or discharged ink droplets do not draw the correct trajectory due to clogging or the like. When there is a defective nozzle LN for which dot DT formation is defective, as shown in FIG. 2, a "missing dot" area (dot omission area AL) for which dot omission pixels PXL for which dots DT are not formed are connected in the scan direction D2 is formed on the object to be recorded 400. Specifically, the plurality of pixels PX constituting the formed image 330 includes the dot omission pixels PXL continuous in the scan direction D2 by the defective nozzles LN included in the plurality of nozzles 64. A colored streak of the object to be recorded 400 occurs on the output image 330 due to the dot omission area AL. If the object to be recorded 400 is white, a white streak occurs. This technology has dots DT by the defective nozzles LN supplemented so as to make it difficult for this kind of streak to stand out.

For convenience of the description, the adjacent nozzles at both sides of the defective nozzles LN in the alignment direction D1 will be called primary neighboring nozzles RN1 and RN2, and the adjacent pixels at both sides of the dot omission pixels PXL in the alignment direction D1 will be called primary neighboring pixels (adjacent pixels) PX1 and PX2. With the example in FIG. 2, dots DT are formed on the primary neighboring pixels PX1 and PX2 by ink droplets 67 discharged from the primary neighboring nozzles RN1 and RN2. Also, the nozzles that are nozzles within a designated distance L1 from the defective nozzle LN in the alignment direction D1 and on the side opposite to the defective nozzles LN from the primary neighboring nozzles RN1 and RN2 are called secondary neighboring nozzles (non-adjacent nozzles) RN3 and RN4, and the pixels that are pixels within the designated distance L1 from the dot omission pixel PXL in the alignment direction D1 and on the side opposite to the dot omission pixel PXL from the primary neighboring pixels PX1 and PX2 are called secondary neighboring pixels (non-adjacent pixels) PX3 and PX4. With the example in FIG. 2, dots DT are formed on the secondary neighboring pixels PX3 and PX4 by ink droplets 67 discharged from the secondary neighboring nozzles RN3 and RN4. The neighboring pixels PX1, PX2, PX3, and PX4 are pixels within the designated distance L1 in the alignment direction D1 from the dot omission pixel PXL. Furthermore, the neighboring nozzles RN1, RN2, RN3, and RN4 are collectively called neighboring nozzles RN, and the neighboring pixels PX1, PX2, PX3, and PX4 are collectively called neighboring pixels PXR. The designated range A10 which is the processing unit for dot supplementation has a total of 10 pixels of Ns=2 pixels continuous in the scan direction D2 respectively for the dot omission pixels PXL and each of the neighboring pixels PX1, PX2, PX3, and PX4. Specifically, the size of the designated range A10 in the scan direction D2 is Ns=2 pixels. Of the designated range A10, there is a first area A1 of a total of 4 pixels of neighboring pixels PX1 and PX3 at one side of the alignment direction D1 from the dot omission area AL, and a second area A2 of a total of 4 pixels of the neighboring pixels PX2 and PX4 at the other side. Specifically, the size of both areas A1 and A2 in the alignment direction D1 is respectively Nn=2 pixels.

As shown in FIG. 1, the numbers 1 through 10 are given to each pixel of the 2×5 pixel designated range A10, in order to identify each pixel of the designated range A10.

The image forming device 1 is equipped with a pattern determining unit U1 and a pattern forming unit U2 as the basic elements. The pattern determining unit U1 determines the pattern P1 of the dots DT after supplementation formed on the neighboring pixels PXR within the designated range A10 based on at least the number Nsum of dots DT to be formed on the pixels PX within the designated range A10 including a portion of the dot omission pixels PXL and a portion of the neighboring pixels PXR when according to the recording data 300 before supplementation of the dots DT by the defective nozzles LN. The pattern forming unit U2 forms the pattern P1 of the dots DT after supplementation.

To perform the process described above, as shown in FIG. 1, pattern tables TBLi in which are stored information expressing the pattern P1 of the dots DT after supplementation are prepared, and the pattern P1 of the dots DT after supplementation can be determined according to the information stored in the pattern tables TBLi. Here, i is information for identifying the pattern table. The pattern tables TBLi store information corresponding to the number Nsum of the dots DT to be formed on the dot omission pixels PXL and the neighboring pixels PXR within the designated range when according to the recording data 300 before dot supplementation.

With the example in FIG. 1, when the dot count Nsum of the 2×5 pixels of the original image 320 when according to the recording data 300 before supplementation is a designated number T1=3 or less, the dot pattern P1 after supplementation is determined according to any of low ink volume pattern tables TBL1, TBL2, and TBL3, and the output image 330 is formed according to the recording data 310 after supplementation. With the example in FIG. 1, shown is the arrangement of the medium dots to be formed on the number 5 and 6 dot omission pixels as supplementation dots on the number 3 and 4 pixels of the first area A1. When 4≤Nsum≤6, the dot pattern P1 after supplementation is determined according to medium ink volume pattern table TBL4. With the example in FIG. 1, shown is when the medium dots to be formed on the number 5 and 6 dot omission pixels are changed to large dots, and they are arranged as supplementation dots in the number 3 pixel of the first area A1 and the number 8 pixel of the second area A2. When 7≤Nsum≤8, the dot pattern P1 after supplementation is determined according to high ink volume pattern table TBL6. With the example in FIG. 1, shown is when the medium dots to be formed on the number 5 and 6 dot omission pixels are changed to large dots and arranged as supplementation dots in the number 3 and 8 pixels. When the dot count Nsum is a second designated number T2=9 or greater which is larger than the designated number T1, the dot pattern P1 after supplementation is determined according to the high ink volume pattern table TBL7. With the example in FIG. 1, shown is when the medium dots to be formed on the number 5 and 6 dot omission pixels are changed to large dots, and these are arranged as supplementation dots in the number 3 and 4 pixels of the first area A1 and the number 7 and 8 pixels of the second area A2. As shown in FIG. 2, these processes are performed in sequence in units of the designated range A10 for band form areas from Nn=2 pixels centered on the dot omission pixels PXL continuous in the scan direction D2 of the original image 320.

The image forming device 1 shown in FIG. 3 is equipped with a RAM (Random Access Memory) 20, a nonvolatile memory 30 (pattern storage unit U3), a defective nozzle detection unit 48, a mechanical part 50, interfaces (I/F) 71 and 72, an operating panel 73 and the like. The controller 10, the RAM 20, the nonvolatile memory 30, the I/F 71 and 72, and the operating panel 73 are connected to a bus 80, and are able to input and output information with each other. The image forming device 1 shown in FIG. 2 is an inkjet printer that discharges ink droplets 67, but it is also possible to apply this technology to an image forming device other than an inkjet printer.

The controller 10 is equipped with a CPU (Central Processing Unit) 11, a color conversion unit 41, a halftone processing unit 42, a drive signal transmission unit 44 and the like. The controller 10 constitutes the pattern determining unit U1, together with the mechanical part 50 constitutes the pattern forming unit U2, together with the operating panel 73 constitutes the setting receiving unit U4, and together with the defective nozzle detection unit 48 constitutes defective nozzle detection unit U5. The controller 10 can be constituted by an SoC (System on a Chip) or the like.

The CPU 11 is a device that centrally performs information processing and control with the image forming device 1. The color conversion unit 41 is an item that converts the input image color space (e.g., RGB (red, green, blue) color space) from a host device 100 memory card 90 or the like to, for example, output coordinate values of the CMYK color space (Cj, Mj, Yj, and Kj) for each pixel. Here, j is information for identifying the pixel. Coordinate values Rj, Gj, Bj, Cj, Mj, Yj, and Kj express the gradation values of multiple gradations with integer values of 256 gradations of 0 to 255, for example. The halftone processing unit 42 performs a designated halftone process such as for example the dither method, the error diffusion method, and the density pattern method on the gradation values of each pixel constituting the image after color conversion to reduce the gradation count of the gradation values, and generates multi-value data. The multi-value data is data expressing the dot formation status, and can be binary data expressing the presence or absence of dot formation, or can be multi-value data of three gradations or greater that can handle dots of different sizes such as large, medium and small dots. With binary data, for example, it is possible to use data for which 1 corresponds to dot formation and 0 corresponds to no dots. As 4-value data, for example, it is possible to use data for which 3 corresponds to large dot formation, 2 corresponds to medium dot formation, 1 corresponds to small dot formation, and 0 corresponds to no dots. The drive signal transmission unit 44 generates drive signals corresponding to the voltage signals applied to a drive element 63 of the recording head 61, and outputs those to a drive circuit 62. For example, if the multi-value data is "large dot formation," drive signals for discharging large dot ink droplets (liquid droplets) 67 are output, if the multi-value data is "medium dot formation," drive signals for discharging medium dot ink droplets 67 are output, and if the multi-value data is "small dot formation," drive signals for discharging small dot ink droplets 67 are output. These units 41, 42, and 44 can be constituted using ASIC (Application Specific Integrated Circuits), and can also directly read data of the processing subject from the RAM 20, or directly write data after processing to the RAM 20.

Furthermore, the controller 10 controls the paper feed mechanism 53 and the like in the mechanical part 50.

The mechanical part 50 controlled by the controller 10 is equipped with a paper feed mechanism 53, a head unit 60, a recording unit 61 and the like, and together with the controller 10 constitutes the pattern forming unit U2. The paper feed mechanism 53 conveys in the paper feed direction D3 the object to be recorded 400 that is continuous in the scan direction D2. Mounted on the head unit 60 are recording heads 61 that discharge ink droplets 67 of a plurality of colors (e.g., CMYK). The recording head 61 is equipped with a drive circuit 62, drive element 63 and the like. The drive circuit 62 applies voltage signals to the drive element 63 according to drive signals input from the controller 10. For the drive element 63, it is possible to use a piezoelectric element that adds pressure to the ink 66 inside the pressure chamber in communication with the nozzles 64, a drive element that generates bubbles within the pressure chamber using heat and discharges ink droplets 67 from the nozzle 64 or the like. The ink (liquid) 66 is supplied to the pressure chamber of the recording head 61 from the ink cartridge (liquid cartridge) 65. The combination of the ink cartridge 65 and the recording head 61 can be provided respectively for CMYK, for example. The ink 66 inside the pressure chamber is discharged as ink droplets 67 facing the object to be recorded 400 from the nozzles 64 by the drive element 63. By the object to be recorded 400 being conveyed in the paper feed direction D3, specifically, by the plurality of nozzles 64 and the object to be recorded 400 being moved relative to each other in the scan direction D2, dots of the ink droplets 67 are formed on the object to be recorded 400 such as printing paper (one type of object to be printed) or the like, and a print image (output image 330) corresponding to the recording data 310 is formed. If the multi-value data is 4-value data, the output image 330 is printed by formation of dots according to the dot size expressed by the multi-value data.

The object to be printed (print substrate) is a material that holds a print image. The shape is typically rectangular, but there are also circles (e.g., CD-ROM, optical disks such as a DVD or the like), triangles, squares, polygons and the like, and at least includes all of the types of paper and paperboard and processed products noted in the Japanese Industrial Standards "JIS P0001: 1998, Paper, Paperboard and Pulp Terminology."

The RAM 20 is large capacity, volatile semiconductor memory, and stores a program PRG2, recording data 300 and 310 and the like. The program PRG2 includes an image forming program for realizing on the image forming device a pattern determining function corresponding to each unit U1, U2, U4, and U5 of the image forming device 1, a pattern forming function, a setting receiving function, and a defective nozzle detection function. The image forming program includes a pattern determining program for realizing on a computer a pattern determining function.

In the nonvolatile memory 30 are stored program data PRG1, pattern tables TBLi and the like. The nonvolatile memory 30 constitutes the pattern storage unit U3. For the nonvolatile memory 30, it is possible to use ROM (Read Only Memory), a magnetic recording medium such as a hard disk, or the like. Expanding the program data PRG1 means writing it to the RAM 20 as a program that can be interpreted by the CPU 11.

The card I/F 71 is a circuit that writes data to the memory card 90 and reads data from the memory card 90. The memory card 90 is nonvolatile semiconductor memory for which data can be read and erased, and in which are stored images taken using an imaging device such as a digital camera or the like. The images are expressed using RGB color space pixel values Rj, Gj, and Bj, for example, and each RGB pixel value is expressed using 8-bit gradation values of 0 to 255, for example.

The communication I/F 72 inputs and outputs information to the host device 100 that is connected to the communication I/F 172 of the host device 100. For the communication I/F 72 and 172, it is possible to use a USB (Universal Serial Bus) or the like. The host device 100 includes computers such as a personal computer, digital cameras, digital video cameras, mobile phones such as smart phones, and the like.

The operating panel 73 has an output unit 74, an input unit 75 and the like, and the user can input various instructions to the image forming device 1. The output unit 74, for example, is constituted by a liquid crystal panel (display unit) that displays information according to the various instructions or information showing the status of the image forming device 1. The output unit 74 can also output these kinds of information using voice. The input unit 75, for example, is constituted by operating keys (operating input unit) such as a cursor key or setting key. The input unit 75 can also be a touch panel for receiving operations on the display screen or the like. The operating panel 73, together with the controller 10, constitutes the setting receiving unit U4 that receives the printing mode from among a plurality of printing modes (settings). The information expressing the input printing mode is stored in the RAM 20, for example.

The defective nozzle detection unit 48 detects whether or not the status of each nozzle 64 constituting the nozzle row 68 is normal. The detection unit 48, together with the controller 10, constitutes the defective nozzle detection unit U5.

Figure 5A:
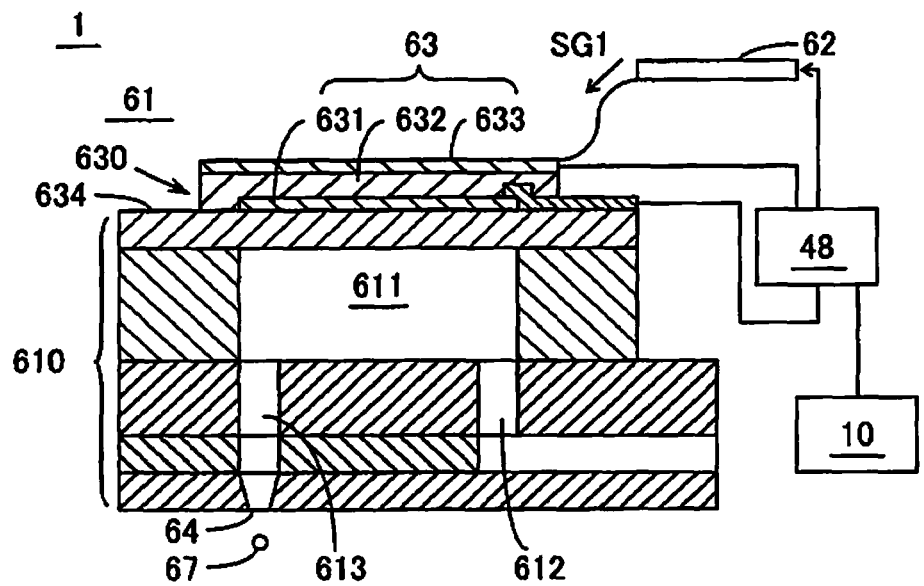
FIG. 5A is a drawing schematically showing an example of the key parts of the image forming device 1.
Figure 5B:
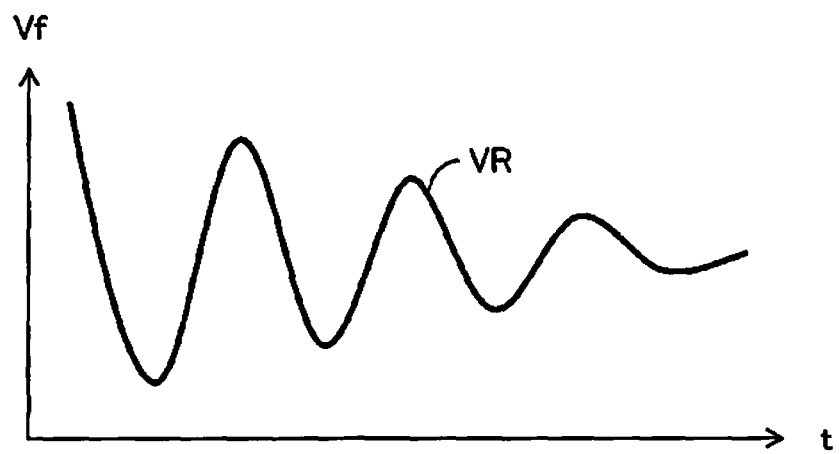
FIG. 5B is a drawing schematically showing an example of the electromotive force curve VR based on the residual vibration of a vibrating plate 630.
Figure 6A:
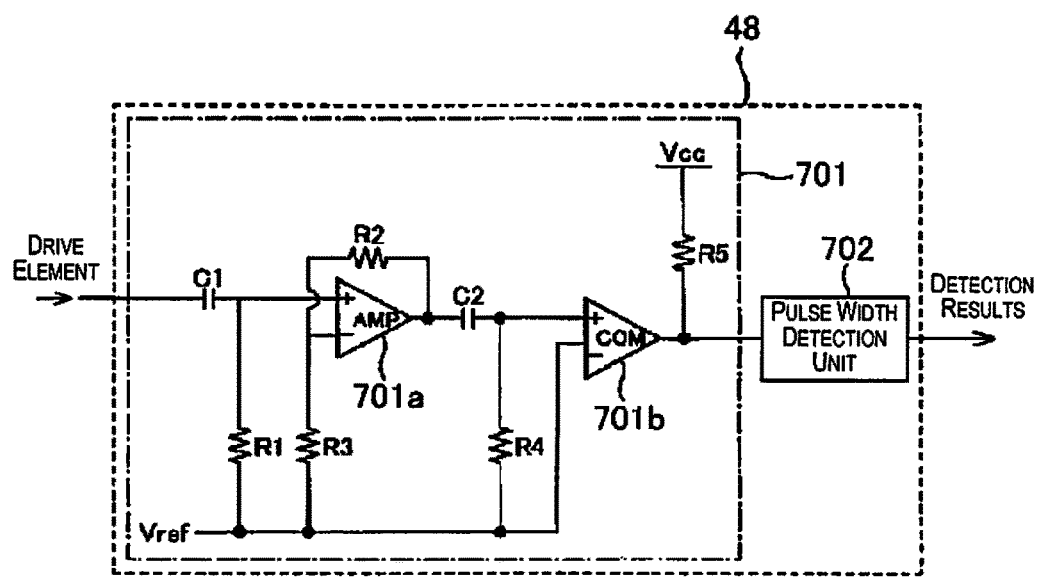
FIG. 6A is a drawing showing an example of the electrical circuits of a defective nozzle detection unit 48.
Figure 6B:
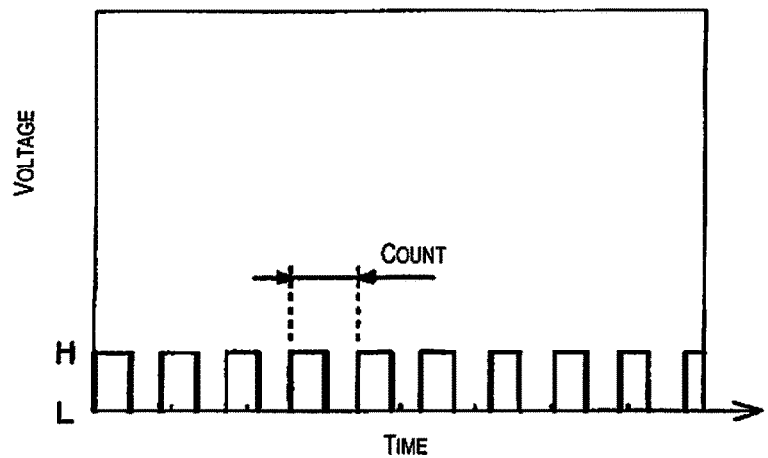
FIG. 6B is a drawing schematically showing an example of the output signals from the amplifier 701.

FIGS. 5A and 5B are drawings for describing examples of methods for detecting the status of the nozzles 64, where FIG. 5A schematically shows an example of the key parts of the image forming device 1, and FIG. 5B schematically shows an example of the electromotive force curve VR based on the residual vibration of a vibrating plate 630. FIG. 6A shows an example of the electrical circuits of a defective nozzle detection unit 48, and FIG. 6B schematically shows an example of the output signals from a comparator 701b.

On a flow path substrate 610 of the recording head 61 shown in FIG. 5A, formed are a pressure chamber 611, an ink supply path 612 in which ink 66 flows to the pressure chamber 611 from the ink cartridge 65, a nozzle communication path 613 in which ink 66 flows from the pressure chamber 611 to the nozzle 64 and the like. For the flow path substrate 610, for example, it is possible to use a silicon substrate or the like. The surface of the flow path substrate 610 is used as a vibrating plate part 634 constituting a portion of the wall surface of the pressure chamber 611. The vibrating plate part 634 can be constituted using silicon oxide or the like, for example. The vibrating plate 630 can be constituted from the vibrating plate part 634, the drive element 63 formed on this vibrating plate part 634 and the like, for example. The drive element 63 can be a piezoelectric element having, for example, a lower electrode 631 formed on the vibrating plate part 634, a piezoelectric layer 632 roughly formed on the lower electrode 631, and an upper electrode 633 roughly formed on the piezoelectric layer 632 or the like. For the electrodes 631 and 633, platinum, gold or the like can be used. For the piezoelectric layer 632, for example, it is possible to use a ferroelectric perovskite type oxide such as PZT (lead zirconate titanate), stoichiometric ratio Pb $(Zr_x, Ti_{1-x})O_3)$ or the like.

FIG. 5A is a block diagram showing the key parts of the image forming device 1 for which a detection unit 48 is provided that detects the status of the electromotive force from the piezoelectric element (drive element 63) based on residual vibration of the vibrating plate 630. One end of the detection unit 48 is electrically connected to the lower electrode 631, and the other end of the detection unit 48 is electrically connected to the upper electrode 633.

FIG. 5B shows an example of the electromotive force curve (electromotive force status) VR of the drive element 63 based on the residual vibration of the vibrating plate 63 that occurs after the supply of drive signals SG1 for discharging ink droplets 67 from the nozzles 64. Here, the horizontal axis is time t, and the vertical axis is electromotive force Vf. The electromotive force curve VR shows an example of ink droplets 67 discharged from a normal nozzle 64. When due to a clog or the like, the ink droplets 67 are not discharged from the nozzle or the discharged ink droplets 67 do not draw the correct trajectory, the electromotive force curve skews from VR. In light of that, it is possible to detect whether the nozzle 64 is normal or defective using a detection circuit like that shown in FIG. 6A.

The detection unit 48 shown in FIG. 6A is equipped with an amplifier 701 and a pulse width detection unit 702. The amplifier 701 is equipped with, for example, an operating amp 701a, a comparator 701b, capacitors C1 and C2, and resistors R1 through R5. When the drive signals SG1 output from the drive circuit 62 are applied to the drive element 63, residual vibration occurs, and electromotive force based on the residual vibration is input to the amplifier 701. The flow frequency component included in this electromotive force is eliminated by a high pass filter constituted by the capacitor C1 and the resistor R1, and the electromotive force after removal of the low frequency component is amplified at a designated amplification rate by the operating amp 701a. The output of the operating amp 701a passes through the high pass filter constituted by the capacitor C2 and the resistor R4, is compared with reference voltage Vref by the comparator 701b, and depending on whether or not it is higher than the reference voltage Vref, is converted to a high level H or low level L pulse state voltage.

FIG. 6B shows an example of pulse form voltage output from the comparator 701b and input to the pulse width detection unit 702. The pulse width detection unit 702 resets the count value when the input pulse form voltage rises, increments the count value every designated period, and outputs that as the detection results of the count value at the rise time of the next pulse form voltage to the controller 10. The count value corresponds to the cycle of the electromotive force based on the residual vibration, and the count value output in sequence shows the frequency characteristics of the electromotive force based on the residual vibration. The frequency characteristics (e.g., cycle) of the electromotive force when the nozzle is the defective nozzle LN are different from the frequency characteristics of the electromotive force when the nozzle is normal. In light of that, the controller 10 is able to judge that the nozzle subject to detection is normal if the sequentially input count value is within an allowed range, and is able to judge that the nozzle subject to detection is the defective nozzle LN if the sequentially input count value is outside the allowed range.

By performing the process described above for each nozzle 64, the controller is able to grasp the status of each nozzle 64, and it is possible to store the information expressing the position of the defective nozzle LN in the RAM 20 or the nonvolatile memory 30, for example.

Of course, detection of defective nozzles LN is not limited to the method described above. For example, discharging ink droplets 67 while sequentially switching the subject nozzle from the plurality of nozzles 64 and receiving operating input of information identifying the nozzle (e.g., the nozzle number) for which dots DT were not formed on the object to be recorded 400 are also included in defective nozzle LN detection. Also, if information identifying the defective nozzle LN before shipping from the manufacturing factory is stored for example in the nonvolatile memory 30, it is not necessary to provide the defective nozzle detection unit U5 in the image forming device 1.

Figure 7:
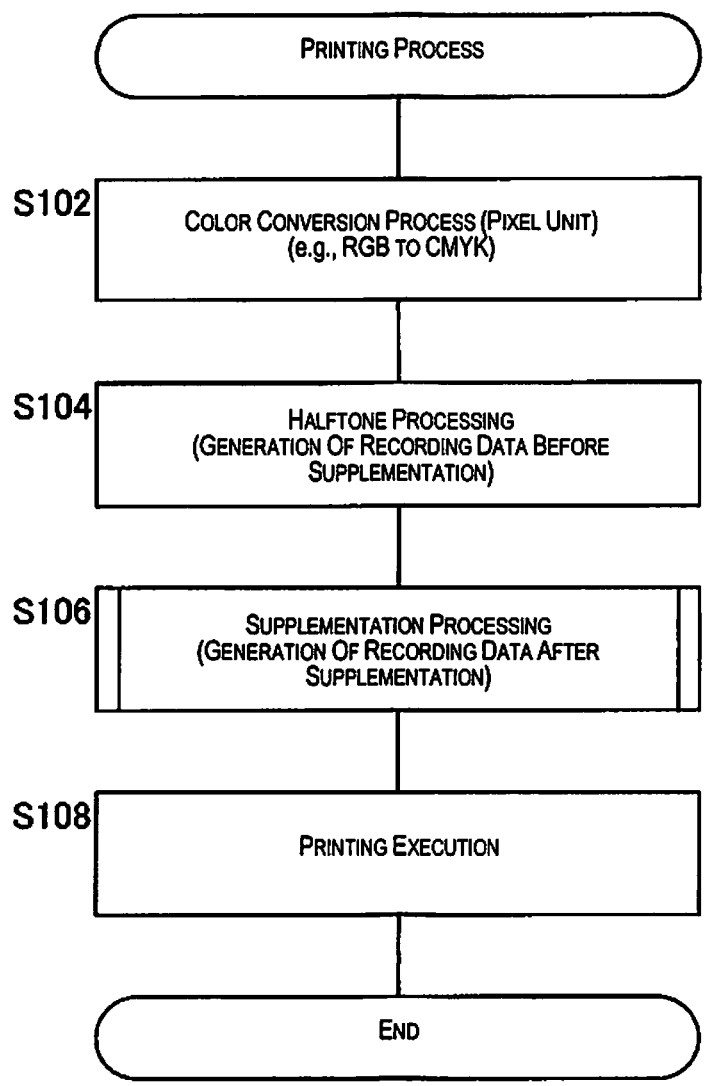
FIG. 7 is a flow chart showing an example of the printing process.
Figure 8:
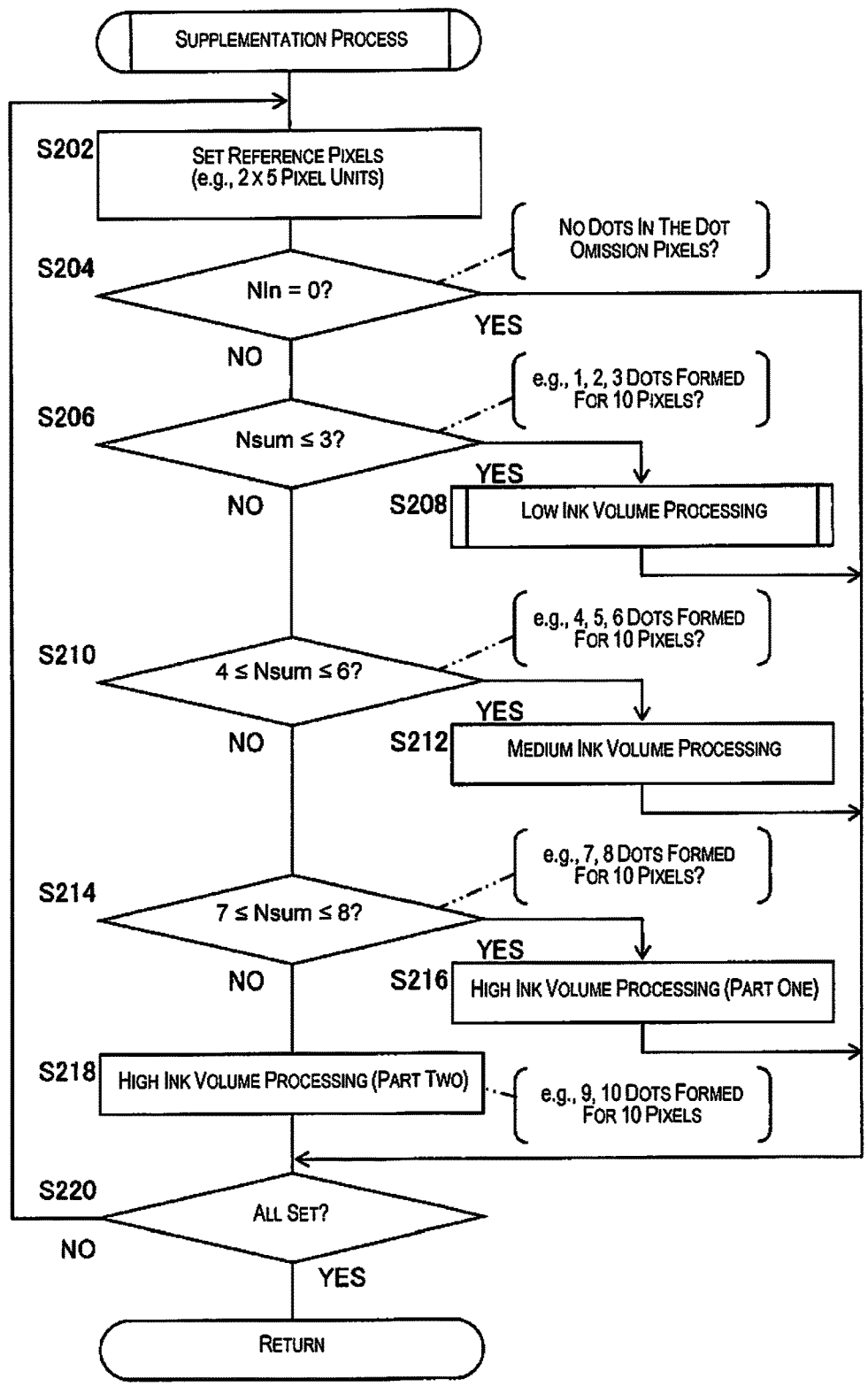
FIG. 8 is a flow chart showing an example of the supplementation process.
Figure 9:
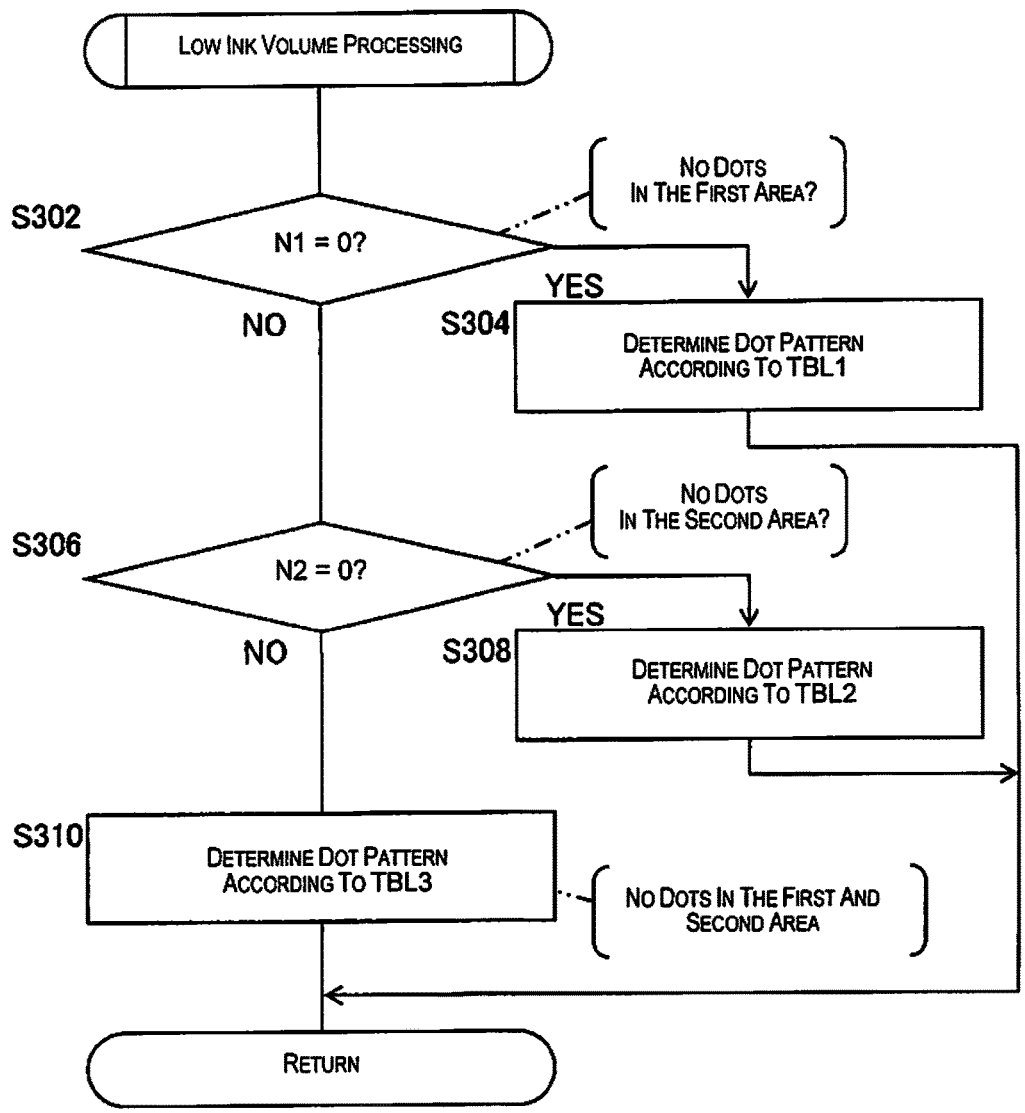
FIG. 9 is a flow chart showing an example of low ink volume processing.

(3) Description of Printing Process Including the Dot Pattern Determining Process:

FIG. 7 is a flow chart showing an example of the printing process performed by the image forming device 1. FIG. 8 is a flow chart showing an example of the supplementation process of step S106 in FIG. 7 according to the dot pattern determining method. FIG. 9 is a flow chart showing an example of the low ink volume processing of step S208 in FIG. 8. Hereafter, we will omit the notation of "step." Here, S106 corresponds to the pattern determining unit U1, the pattern determining step, and the pattern determining function. S108 corresponds to the pattern forming unit U2, the pattern forming step, and the pattern forming function. The printing process can be realized using electrical circuits or can be realized using a program.

(3-1) Printing Process:

For example, when an image and printing instructions are received from the host device 100, the image forming device 1 stores the received image in the RAM 20, and starts the printing process. The images recorded in the memory card 90 undergo the selection operation with the operating panel 73, the image forming device 1 stores the selected image in the RAM 20, and the printing process is started.

When the printing process is started, the controller 10 performs pre-processing such as expanding the program data PRG1 within the nonvolatile memory 30 or converting the input image resolution or the like as necessary, after which it converts the input pixel values (e.g., Rj, Gj, Bj) of the input image space for each pixel to for example output pixel values Cj, Mj, Yj, and Kj of the CMYK color space (S102). At S104, a designated halftone process is performed by the halftone processing unit 42 on the image of the CMYK color space constituted by a concentration of pixel values Cj, Mj, Yj, and Kj of 256 gradations, for example, reducing the gradation count, and multi-value data is generated that expresses the dot forming status for each pixel respectively for CMYK. This multi-value data can be binary data expressing the presence or absence of dot formation, can be 4-value data for which the respective large, medium and small dots can be formed, or it can be multi-value data other than these. The generated multi-value data becomes the recording data 300 before dot supplementation expressing gradations for the original image 320. At S106, supplementation processing is performed on the recording data 300 before dot supplementation, and recording data 310 after dot supplementation is generated. This recording data 310 is multi-value data expressing the dot formation status for each pixel respectively for CMYK, and can be 4-value data for which the respective large, medium, and small dots can be formed, or can be another multi-value data. At S108, the aforementioned drive signals corresponding to the recording data 310 after dot supplementation respectively for large, medium, and small are generated and output to the drive circuit 62 of the recording head 61, the drive element 63 is driven to match the recording data 310 after supplementation, and ink droplets 67 are discharged from the nozzles 64 of the recording head 61 to execute printing. By doing this, a print image (output image 330) of the multi-value (e.g., 4-value) expressing the dot forming status is formed on the object to be recorded 400, and the printing process ends.

(3-2) Supplementation Process:

Next, we will describe the supplementation process while referring to FIG. 8 and the like. To make the description easier to understand, the recording data 300 before dot supplementation is data that expresses the presence or absence of medium dot formation, for example data that correlates 2 (or 1) to medium dot formation, and 0 to no dots. Of course, the recording data 300 before supplementation can also be 4-value data or the like that correlates 3 to large dot formation, 2 to medium dot formation, 1 to small dot formation, and 0 to no dots. In this case, it is also possible to perform the supplementation process regarding the large dots and small dots expressed by the recording data 300 as medium dots.

When the supplementation process is started, as shown in FIG. 2, the controller 10 sets 2×5 pixels as reference pixels within the designated range A10 in sequence from the dot omission pixels PXL and the neighboring pixels PXR continuous in the scan direction D2 with the original image 320 expressed by the record data 300 within the RAM 20 (S202). With the example in FIG. 2, Ns=2 pixels of the dot omission pixels PXL continuous in the scan direction D2, and Ns=2 pixels respectively for the neighboring pixels PX1, PX2, PX3, and PX4 up to Nn=2 pixels from the dot omission pixels PXL in the alignment direction D1 are set as the reference pixels. The setting sequence of the reference pixels is not particularly limited, and it is possible to use the scan direction D2 sequence such as the designated range A101, A102, A103, . . . and the like.

The size Ns of the designated range A10 in the scan direction is preferably 2 pixels or greater since then the degree of freedom for the formed dot pattern is high, and can also be 3 pixels or greater, but when it is 2 pixels, it is possible to do dot supplementation quickly. Also, the size Nn of the designated range A10 in the alignment direction is preferably 2 pixels or greater since then the degree of freedom for the formed dot pattern is high, and can also be 3 pixels or greater, but when it is 2 pixels, it is possible to do dot supplementation quickly.

At S204, a judgment is made of whether or not the count Nln of the dots DT to be formed on the dot omission pixels PXL within the designated range A10 is 0. When Nln=0, the dots to be supplemented are not in the dot omission pixels PXL, so the controller 10 advances the process to S220 without performing the processes of S206 to S218. When Nln does not equal 0, specifically, when the dot count Nln of the dot omission pixel PXL is 1 or 2, the controller 10 branches the process as shown below based on the number Nsum of the dots DT to be formed on the reference pixels within the designated range A10 when according to the recording data 300 before supplementation.

When 1≤Nsum≤3, (S206), low ink volume processing is executed (S208)

When 4≤Nsum≤6, (S210), medium ink volume processing is executed (S212)

When 7≤Nsum≤8, (S214), high ink volume processing (part one) is executed (S216)

When 9≤Nsum≤10, high ink volume processing (part two) is executed (S218)

As shown in FIG. 8, the processes of S206, S210, and S214 are processes for judging whether or not the dot number Nsum fulfills designated conditions. The processes of S208, S212, S216, and S218 are processes for determining the dot pattern P1 after supplementation according to information stored in the pattern tables TBLi (examples shown in FIGS. 10 to 14) corresponding to the dot count Nsum. When according to the recording data 300 before supplementation, all the dots to be formed are medium dots, and the ink duty (ink implantation volume) on the object to be recorded 400 is (Nsum/100)×100%.

From the above, the controller 10 determines the pattern P1 of the dots DT after supplementation based on at least the dot count Nsum in the designated range A10 and the dot count Nln in the dot omission area AL within the designated range A10 when according to the recording data 300 before supplementation. At that time, of the plurality of pattern tables TBLi such as those shown in FIGS. 10 through 14, the dot pattern P1 after supplementation is determined according to the information stored in the pattern table TBLi corresponding to the dot count Nsum when according to the recording data 300 before supplementation.

After any of the processes of the aforementioned S208, S212, S216, and S218 is performed, the controller 10 judges whether or not the reference pixels have been set for all the dot omission pixels PXL and the neighboring pixels PXR of the original image 320 (S220). When unprocessed pixels remain, the controller 10 repeats the process of S202 to S220. By this process repetition, the dot pattern P1 after supplementation formed on the neighboring pixels PXR within the designated range A10 is determined based on the dot count Nsum of the referenced pixels set in sequence from among the dot omission pixels v̂XL and the neighboring pixels PXR continuous in the scan direction D2. On the other hand, when all the reference pixels are set, the controller 10 ends the supplementation process. After that, the printing process of S108 in FIG. 7 is performed, and for example a 4-value print image (output image 330) corresponding to the recording data 310 after dot supplementation is formed on the object to be recorded 400.

Figure 10:
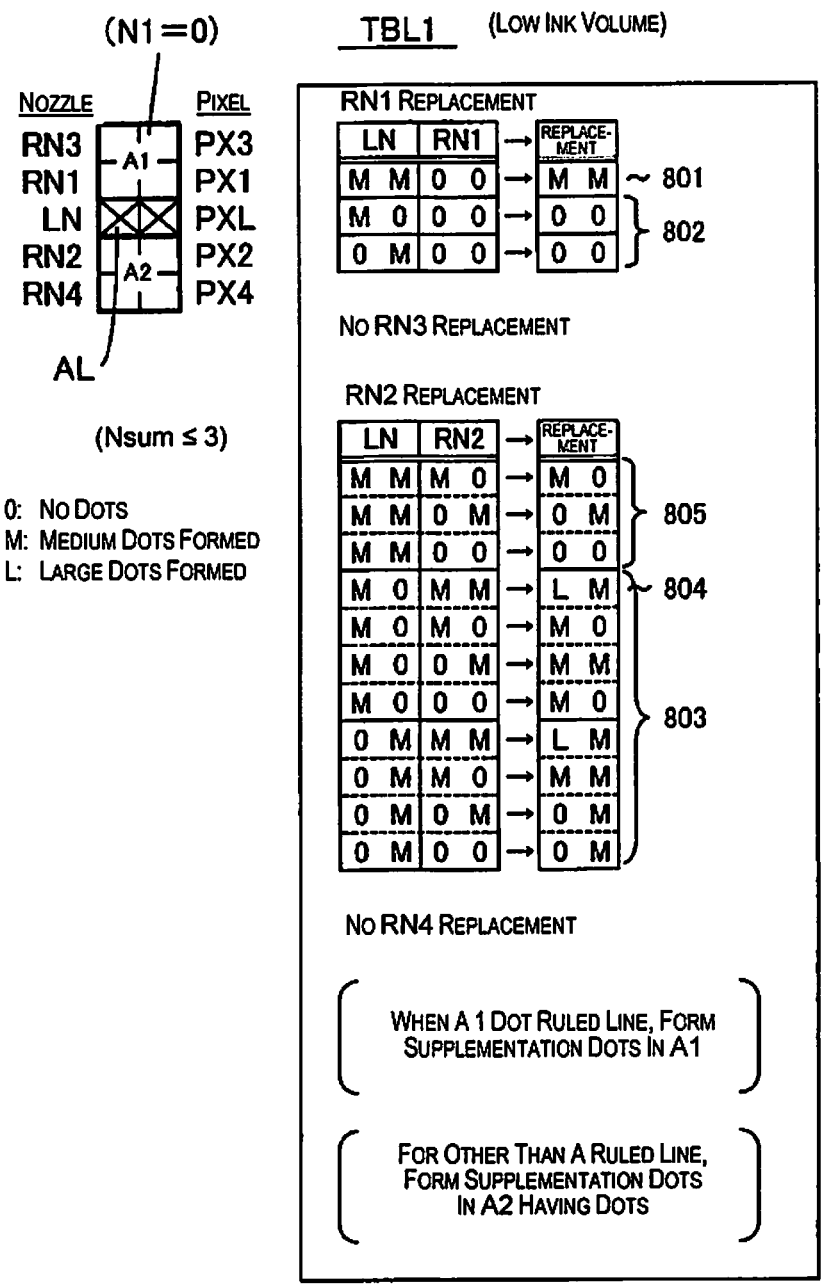
FIG. 10 is a drawing schematically showing an example of the structure of the low ink volume pattern table TBL1.
Figure 12:
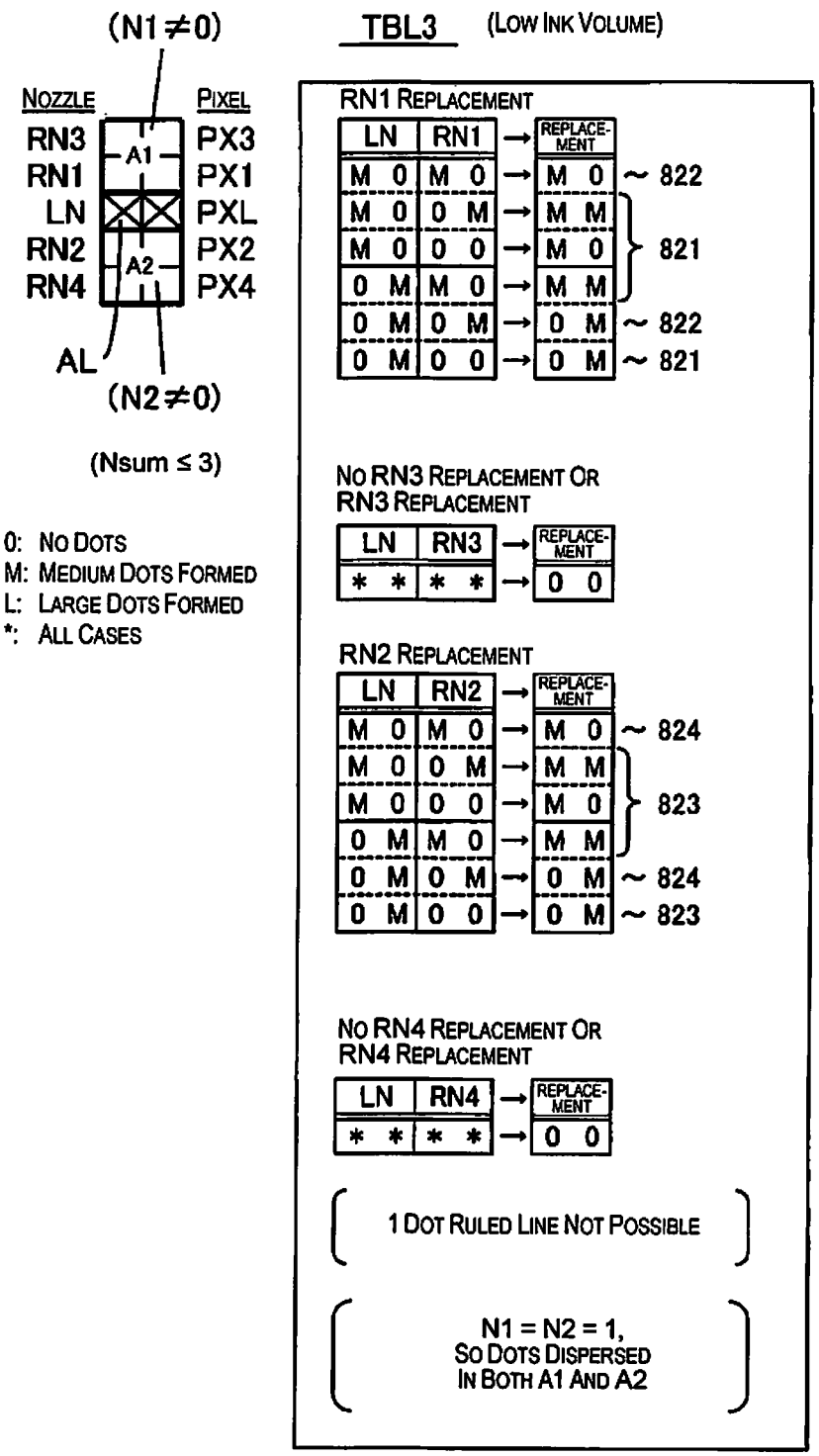
FIG. 12 is a drawing schematically showing an example of the structure of the low ink volume pattern table TBL3.

(3-3) Low Ink Volume Processing:

Next, referring to FIGS. 9 through 12, 15, 16 and the like, we will describe the low ink volume processing performed when the dot count Nsum in the designated range A10 is a designated number T1=3 or less, specifically, is any of 1, 2, or 3. Here, FIG. 10 schematically shows an example of the structure of the low ink volume pattern table TBL1 referenced when the dot count N1 for the neighboring pixels PX1 and PX3 of the first area A1 when according to the recording data 300 before supplementation is 0. FIG. 11 schematically shows an example of the structure of the low ink volume pattern table TBL2 referenced when the dot count N2 for the neighboring pixels PX2 and PX4 of the second area A2 when according to the recording data 300 before supplementation is 0. FIG. 12 schematically shows an example of the structure of the low ink volume pattern table TBL3 referenced when N1 does not equal 0, and N2 does not equal 0. FIG. 15 schematically shows an example of the dot pattern P1 formed on the low ink volume image when the dots DT to be formed on the dot omission pixels PXL within the designated range A10 when according to the recording data 300 before supplementation are not continuous in the scan direction D2. FIG. 16 schematically shows an example of the dot pattern P1 formed on the low ink volume image when the dots DT to be formed on the dot omission pixels PXL within the designated range A10 when according to the recording data 300 before supplementation are continuous in the scan direction D2.

When the low ink volume processing shown in FIG. 9 is started, the controller 10 branches the process based on the dot count N1 with the first area A1 and the dot count N2 with the second area A2. In specific terms, when N1=0 (S302), the dot pattern P1 is determined according to the information stored in the pattern table TBL1 (S304), and low ink volume processing is ended. When N2=0 (S306), the dot pattern P1 is determined according to the information stored in pattern table TBL2 (S308), and the low ink volume processing is ended. When N1≠0 and N2≠0, the dot pattern P1 is determined according to the information stored in the pattern table TBL3 (S310), and the low ink volume processing is ended. Working in this way, the controller 10 determines the dot pattern P1 after supplementation based on at least the dot count Nsum for the designated range A10 when according to the recording data 300 before supplementation, the dot count N1 of the first area A1, and the dot count N2 of the second area A2.

First, we will describe the pattern table TBL1 referenced when N1=0 and the pattern table TBL2 referenced when N2=0 according to FIGS. 10 and 11. Here, "RN1 replacement," "RN2 replacement," "RN3 replacement," and "RN4 replacement" respectively show the dot arrangements before and after supplementation according to the dot arrangement of the dot omission pixels PXL and the primary neighboring pixels for the neighboring pixels PX1, PX2, PX3, and PX4 corresponding to neighboring nozzles RN1, RN2, RN3, and RN4. "0" indicates no dots, "M" indicates medium dot formation, and "L" indicates large dot formation. The ink volume for forming large dots is acceptable as long as it is greater than the ink volume for forming medium dots, and for example, can be approximately twice the ink volume for forming the medium dots. With RN1 and RN2 replacement, the "LN" dot arrangement is the dot arrangement before supplementation of the dot omission pixels PXL, "RN1" is the dot arrangement before supplementation of the primary neighboring pixel PX1, "RN2" is the dot arrangement before supplementation of the primary neighboring pixel PX2, and "replacement" is the dot arrangement after replacement of the primary neighboring pixels PX1 and PX2. For example, with the correlation 801, when "LN" is "MM," and "RN1" is "00," the dot arrangement of the primary neighboring pixel PX1 after supplementation is "MM." A dot arrangement that cannot occur in "LN, "RN1," and "RN2" of the pattern table TBLi shown in FIGS. 10 to 14 is not shown, but it is also possible to stipulate a correlation of dot arrangements that cannot occur with the pattern table TBLi to prevent erroneous operation.

One characteristic feature of the pattern tables TBL1 and TBL2 includes the fact that when "LN" is "M0" and "0M" for which the dots are not continuous, specifically, when ruled lines are not formed on the dot omission pixels PXL, though the process of comparing the dot count N1 and the dot count N2 is not performed, dots are arranged for supplementing the pixels of the area for which the dot count N1 and the dot count N2 are larger between the first area A1 and the second area A2. When N1=0, though there are cases when N2=0, if N2 does not equal 0, then N2>N1. In light of that, in the case of the pattern table TBL1, dots are not formed as with the correlation 802 on the primary neighboring pixel PX1 of the first area A1, but rather supplementation dots as with the correlation 803 are formed on the primary neighboring pixels PX2 of the second area A2. When "RN2" is "MM," it is not possible to add medium dots to the primary neighboring pixel PX2, so at least one medium dot is replaced with a large dot (supplementation dot). For example, in the case of the correlation 804, when "LN" is "M0," and "RN1" is "MM," the dot arrangement of the primary neighboring pixel PX1 after supplementation is "LM." This "L" is the supplementation dot. In this way, dots for which the size has been changed are included in the dot pattern P1 after supplementation.

The pattern tables TBLi shown in FIGS. 10 to 14 have as their subject an image forming device for which large dots can only be formed in one of the pixels among two pixels aligned in the scan direction D2 within the designated range A10.

On the other hand, when N2=0, though there are cases when N1=0, if not N1=0, then N1>N2. In light of that, in the case of the pattern table TBL2, dots are not formed as with the correlation 811 on the primary neighboring pixel PX2 of the second area A2, but rather, supplementation dots are formed as with the correlation 812 on the primary neighboring pixel PX1 of the first area A1.

Another characteristic feature of the pattern tables TBL1 and TBL2 is that when "LN" is "MM" for which dots are continuous, specifically, when there is a possibility that a one dot ruled line is formed on the dot omission pixels PXL, supplementation dots are arranged in the neighboring pixels PXR of one or the other of the first area A1 and the second area A2 (in the example in FIGS. 10 and 11, primary neighboring pixel PX1 of the first area A1) for all the supplementation dots. For example, in the case of the correlation 801 of the pattern table TBL1, when "LN" is "MM," and "RN1" is "00," the supplementation dots are arranged with the dot arrangement of the primary neighboring pixel PX1 of the first area A1 after supplementation as "MM". In the case of the correlation 805 of the pattern table TBL1, the dot arrangement of the primary neighboring pixel PX2 of the second area A2 does not change before and after supplementation. Therefore, all the supplementation dots are arranged in the first area A1.

In the case of the correlation 813 of the pattern table TBL2, when "RN1" is "M0," the supplementation dots are arranged with the dot arrangement of the primary neighboring pixel PX1 of the first area A1 after supplementation as "LM." In the case of the correlation 814 of the pattern table TBL2, when "RN1" is "0M," the supplementation dots are arranged with the dot arrangement of the primary neighboring pixel PX1 of the first area A1 after supplementation as "LM." In the case of correlation 815 of the pattern table TBL2, when "RN1" is "00," the supplementation dots are arranged with the dot arrangement of the primary neighboring pixel PX1 of the first area A1 after supplementation as "MM,". On the other hand, in the case of the correlation 816 pattern table TBL2, the dot arrangement of the primary neighboring pixel PX2 of the second area A2 before and after supplementation stay the same at "00." Therefore, all the supplementation dots are arranged in the first area A1.

Furthermore, another characteristic feature of the pattern tables TBL1 and TBL2 is leaving the dot arrangement of "RN3" and "RN4" (secondary neighboring pixels PX3, PX4) as is. This is because the ink duty for the object to be recorded 400 is low at (3/10)×100=about 30% or less, and not forming supplementation dots on the secondary neighboring pixels PX3 and PX4 improves the quality of the output image 330.

Next, we will describe the pattern table TBL3 that is referenced when N1≠0 and N2≠0 according to FIG. 12. The dot count Nsum for the designated range A10 is 1 or more and 3 or less, and the dot count Nln for the dot omission area AL is 1 or greater, so the dot count N1 for the first area A1 is 1, and the dot count N2 for the second area A2 is also 1, and the dot count Nln for the dot omission area AL is also 1. From this fact, with "LN," there is only "M0" and "0M" for which the dots are not continuous, and a one dot ruled line is not formed on the dot omission pixels PXL. Also, since N1=N2, the correlation of the pattern table TBL3 is stipulated so that the supplementation dots are randomly dispersed to both areas A1 and A2. For example, in the case of the correlation 821, supplementation dots are arranged on the primary neighboring pixel PX1 of the first area A1 after supplementation. In the case of the correlation 822, specifically, when "LN" is "M0" and "RN1" is "M0," or "LN" is "0M" and "RN1" is "0M," the dot arrangement of the primary neighboring pixel PX1 of the first area A1 does not change before and after supplementation. Also, in the case of correlation 823, supplementation dots are arranged in the primary neighboring pixel PX2 of the second area A2 after supplementation. In the case of the correlation 824, specifically, when "LN" is "M0" and "RN2" is "M0," or "LN" is "0M" and "RN2" is "0M," the dot arrangement in the primary neighboring pixel PX2 of the second area A2 does not change before and after supplementation. By having the correlation of "RN2" according to the dot arrangement of "LN" be the same as the correlation of "RN1" according to the dot arrangement of "LN," supplementation dots are formed in the first area A1 and the second area A2 at the same probability. Since N1=N2, a good quality output image 330 is obtained.

For the pattern table TBL3 as well, the "RN3" and "RN4" (secondary neighboring pixel PX3 and PX4) dot arrangement can also be left as is. However, since the pattern table TBL3 is used when the ink duty is relatively high ink duty within the low ink duty range at (3/10)×100=about 30%, if there is occurrence of concentration unevenness with an area included in the dot omission area AL in the output image 330 being slightly too concentrated, it is possible to replace "RN3" and "RN4" with "00."

Following, referring to FIGS. 15 and 16, we will describe the operation and effect of the image forming device 1. In the top sections of these drawings, shown are examples of the original image 320 before supplementation of dots that are not actually formed, and in the lower sections are shown examples of the output image 330 after supplementation of dots that are actually formed. The output image 330 is formed as a print image on the object to be recorded 400, for example.

First, FIG. 15 shows an example of dot supplementation for the original image 320 with low ink duty for which in each designated range A101 to A108, "LN" is "M0" or "0M," and the dot count N1 for the first area A1 and the dot count N2 for the second area A2 are different. In this case, ruled lines are not formed in the dot omission pixels PXL, so supplementation dots are formed on pixels of the area for which the dot count N1 and the dot count N2 is larger among the first area A1 and the second area A2 according to one or the other of the pattern table TBL1 and TBL2. For example, N=1 for the designated range A101, so the pattern table TBL1 like that shown in FIG. 10 is referenced, and according to "MM" corresponding to "LN" being "M0" and "RN2" being "0M," new medium dots are arranged as supplementation dots and formed in the number 7 pixel which is the primary neighboring pixel PX2 of the second area A2. For the primary neighboring pixel PX1, dots are not formed, according to "00" corresponding to "LN" being "M0" and "RN1" being "00." For the designated range A102, N2=0, so the pattern table TBL2 like that shown in FIG. 11 is referenced, and new medium dots are arranged as the supplementation dots in the number 3 pixel that is the primary neighboring pixel PX1 of the first area A1 according to "MM" corresponding to "LN" being "M0" and "RN1" being "0M." For the primary neighboring pixel PX2, dots are not formed, according to "00" corresponding to "LN" being "M0" and "RN2" being "00." For the designated range A103, the pattern table TBL1 is referenced, and large dots are arranged and formed at the number 7 pixel which is the primary neighboring pixel PX2 of the second area A2 according to "LM" corresponding to "LN" being "0M" and "RN2" being "MM." These large dots are supplementation dots changed from medium dots. For the primary neighboring pixel PX1, dots are not formed, according to "00" corresponding to "LN" being "M0" and "RN1" being "00."

From the facts above, when a ruled line is not formed on the dot omission pixels PXL, by concentrating dots DT in the area with a greater dot count among the areas A1 and A2 in the vicinity of the dot omission area AL, dot supplementation is done more suitably, and the image quality of the output image 330 is improved.

FIG. 16 shows an example of dot supplementation for the low ink duty original image 320 for which "LN" is continuous dots "MM." In this case, it is possible that a one dot ruled line will be formed on the dot omission pixels PXL, so according to one or the other of the pattern tables TBL1 and TBL2, all the supplementation dots are formed in the primary neighboring pixel PX1 of the first area A1. For example, for the designated range A101, the pattern table TBL1 such as that shown in FIG. 10 for which N1=0 is referenced, and new medium dots are arranged and formed as supplementation dots in the number 3 and 4 pixels which are primary neighboring pixels PX1 of the first area A1 according to "MM" corresponding to "LN" being "MM" and "RN1" being "00." For the primary neighboring pixel PX2, dots are not formed, according to "00" corresponding to "LN" being "MM" and "RN2" being "00." For the designated range A102, N2=0, so the pattern table TBL2 like that shown in FIG. 11 is referenced, and new medium dots are arranged and formed as supplementation dots in the number 3 and 4 pixels which are primary neighboring pixels PX1 of the first area A1 according to "MM" corresponding to "LN" being "MM" and "M1" being "00." For the primary neighboring pixel PX2, dots are not formed, according to "00" corresponding to "LN" being "MM" and "RN2" being "00." For the designated range A104, the pattern table TBL2 is referenced, and large dots are arranged and formed as supplementation dots at the number 3 pixel which is the primary neighboring pixel PX1 of the first area A1 according to "LM" corresponding to "LN" being "MM" and "RN1" being "0M." For the primary neighboring pixel PX2, dots are not formed, according to "00" corresponding to "LN" being "MM" and "RN2" being "00." For the designated range A105, the pattern table TBL2 is referenced, and large dots are formed as supplementation dots for the number 3 pixel and medium dots are formed as supplementation dots on the number 4 pixel which are primary neighboring pixels PX1 of the first area A1 according to "LM" corresponding to "LN" being "MM" and "RN1" being "M0."

Figure 20:
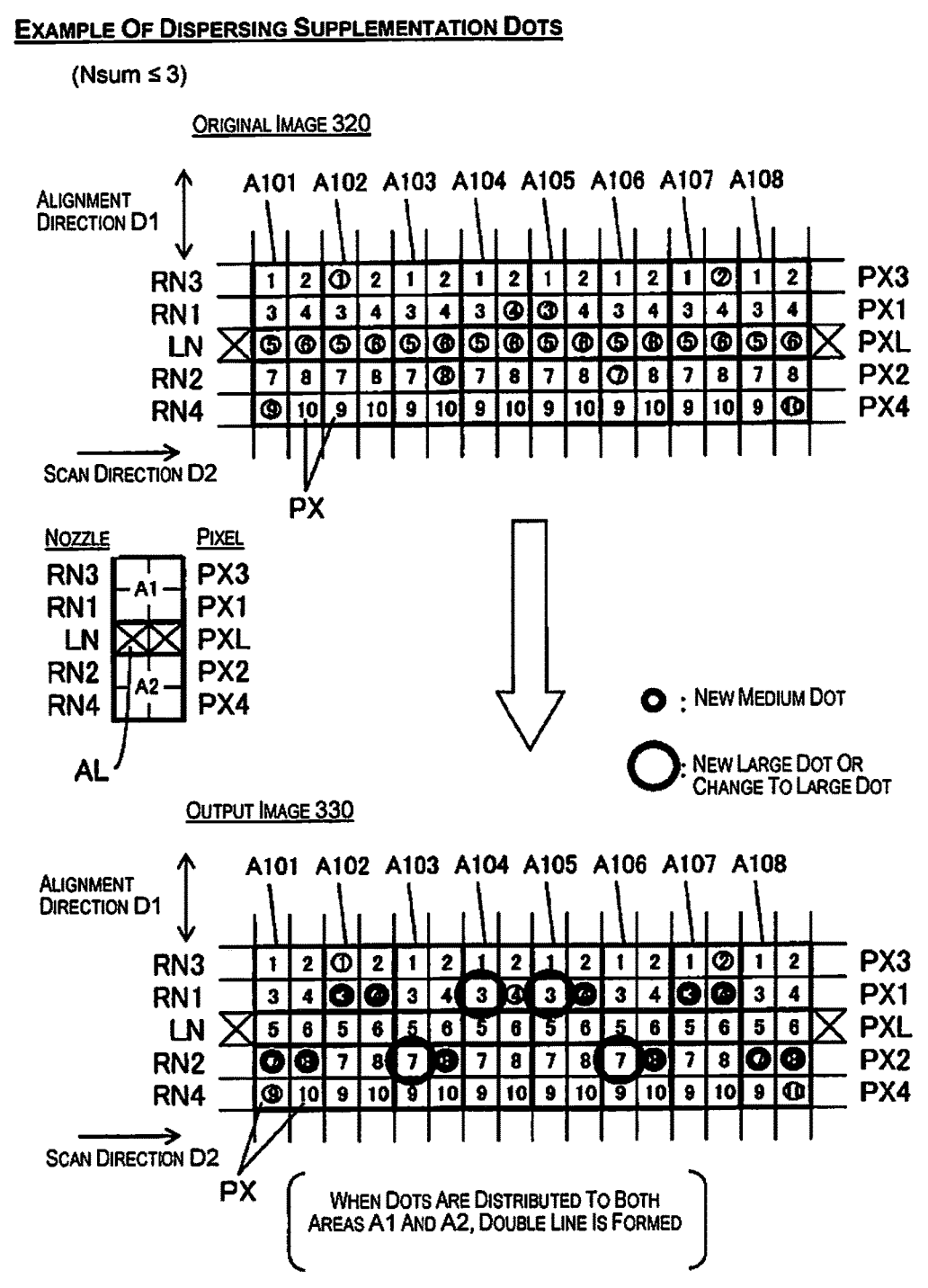

Here, we will compare this with the example shown in FIG. 20. FIG. 20 shows an example of the supplementation dots being dispersed in the areas A1 and A2 when dots are formed continuously in the scan direction D2 on the dot omission pixels PXL. With this example, supplementation dots are formed on the primary neighboring pixel PX1 of the first area A1, and supplementation dots are also formed on the primary neighboring pixel PX2 of the second area A2. In this case, despite there only being a one dot ruled line formed on the dot omission pixels PXL on the original image 320, a double line is formed for which dots are arranged discretely in the scan direction D2 on the primary neighboring pixels PX1 and PX2 sandwiching the dot omission pixels PXL in the nozzle alignment direction D1. With this, the image quality of the output image 330 decreases.

With this technology shown by example in FIG. 16, the density of the dots DT within the designated range A10 is low, and when there is a high possibility of a one dot ruled line being formed on only the dot omission area AL in the original image 320, all the supplementation dots are arranged in the first area. By doing this, double line formation due to dot supplementation is suppressed, more suitable dot supplementation is done, and the image quality of the output image 330 is improved. In particular, by having the determined dot pattern P1 be applied continuously in the scan direction D2, double line formation due to dot supplementation is reliably suppressed.

The pattern tables TBL1 and TBL2 can also have a correlation for which when "LN" is "MM," all the supplementation dots are arranged in the second area A2. In this case, by arranging all the supplementation dots in the second area A2, double line formation due to dot supplementation is suppressed, dot supplementation is done more suitably, and the image quality of the output image 330 is improved.

By using the pattern tables TBL1 to TBL3 described above, this technology performs the dot supplementation process quickly, and is able to suitably supplement dots DT by the defective nozzle LN efficiently. Also, dots for which the size has been changed are included in the dot pattern P1 after supplementation, so this technology has a high degree of freedom for the dot pattern P1, and even more suitable dot supplementation can be performed.

(3-4) Medium Ink Volume Processing:

Next, we will describe medium ink volume processing of S212 in FIG. 8 performed when the dot count Nsum for the designated range A10 is a designated number T1=greater than 3 and 6 or less, specifically, when it is one of 4, 5, or 6. The pattern table TBL4 referenced during this processing, though not illustrated, the same as the pattern tables TBL1 to TBL3, has correlations of the dot arrangement before and after supplementation stipulated according to the dot arrangements of the dot omission pixels PXL and the primary neighboring pixels for the neighboring pixels PX1, PX2, PX3, and PX4 corresponding to neighboring nozzles RN1, RN2, RN3, and RN4. For example, we'll assume that for the dot arrangement of a certain "LN," when "RN1" is "AB" (A, and B are respectively 0 or M), the dot arrangement after replacement is "CD" (C and D are respectively 0 or M or L). In this case, the image forming device 1 replaces the dot arrangement "AB" with "CD" of the primary neighboring pixel PX1 before supplementation and forms dots according to the pattern table TBL4 with the medium ink volume process. By using the pattern table TBL4, this technology performs the dot supplementation process quickly, and it is possible to suitably supplement the dots DT by the defective nozzle LN efficiently.

(3-5) High Ink Volume Processing when 7≤Nsum≤8:

Next, we will refer to FIG. 13 and describe the high ink volume process (part one) of S216 in FIG. 8 performed when the dot count Nsum for the designated range A10 is 7 or greater and 8 or less, specifically, 7 or 8. FIG. 13 schematically shows an example of the structure of the high ink volume pattern table TBL6 referenced when 7≤Nsum≤8. Here, "S" indicates small dot formation. The ink volume for forming small dots can be smaller than the ink volume for forming medium dots, for example it can be approximately ½ the ink volume for forming medium dots.

One characteristic feature of the pattern table TBL6 is that at least a portion of the dots formed on the primary neighboring pixels (adjacent pixels) PX1 and PX2 among the neighboring pixels PXR within the designated range A10 is made larger, and at least a portion of the dots formed on the secondary neighboring pixels (non-adjacent pixels) PX3 and PX4 excluding the primary neighboring pixels PX1 and PX2 among the neighboring pixels PXR are made smaller (including eliminating them). Eliminating a portion of the dots formed on the secondary neighboring pixels PX3 and PX4 means culling (reducing the dot count) dots formed on the secondary neighboring pixels PX3 and PX4. When the band area up to Nn=2 pixels centering on the dot omission pixels PXL of the original image 320 is high ink duty at 7≤Nsum≤8 (ink duty approximately 70 to 80%), color streaks in the object to be recorded 400 stand out easily due to dot omission pixels PXL that are continuous in the scan direction D2. In light of that, by making at least a portion of the dots DT formed in the primary neighboring pixels PX1 and PX2 adjacent to the dot omission pixels PXL larger, it is harder for the dot omission area AL streaks to stand out. However, when the ink duty is approximately 70 to 80%, when at least a portion of the dots DT formed on the primary neighboring pixels PX1 and PX2 are made larger, there are cases when concentration unevenness occurs such as when the area including the dot omission area AL with the output image 330 is slightly too concentrated. In light of that, by having at least a portion of the size of the dots formed on the secondary neighboring pixels PX3 and PX4 be smaller (including being culled), excessive supplementation by having too much dot supplementation is suppressed. For example, in the case of correlations 831 and 832, the "M" of "RN1" and "RN2" is replaced with the "L" supplementation dots. In the case of correlations 833 and 834, the "0" of "RN1" and "RN2" is replaced with the "L" supplementation dots. For "RN3" and "RN4," a portion of "M" is replaced with "0" or "S."

From the above, when the high ink volume processing (part one) of S216 in FIG. 8 is performed, and the dot pattern P1 is determined according to the pattern table TBL6, large dots are formed for at least a portion of the primary neighboring pixels PX1 and PX2, and either the number of dots formed on the secondary neighboring pixels PX3 and PX4 is reduced or small dots are formed for at least a part of the secondary neighboring pixels PX3 and PX4. Therefore, it is difficult for the streaks of the dot omission area AL to stand out, and excessive supplementation of too much dot supplementation being done is suppressed, so the image quality of the output image 330 is improved.

(3-6) High Ink Volume Processing when Nsum≥9:

Next, while referring to FIGS. 14 and 17, we will describe the high ink volume processing (part two) of S218 in FIG. 8 that is performed when the dot count Nsum for the designated range A10 is a second designated number T2=9 or greater, specifically, when it is 9 or 10. Here, FIG. 14 schematically shows an example of the structure of the high ink volume pattern table TBL7 referenced when Nsum≥9. FIG. 17 schematically shows an example of the dot pattern P1 formed on the high ink volume pixels.

One characteristic feature of the pattern table TBL7 is that at least a portion of the dots formed on the primary neighboring pixels (adjacent pixels) PX1 and PX2 among the neighboring pixels PXR within the designated range A10 is made larger, and the size of the dots formed in the secondary neighboring pixels (non-adjacent pixels) PX3 and PX4 excluding the primary neighboring pixels PX1 and PX2 among the neighboring pixels PXR is maintained. When the band area up to Nn=2 pixels centered on the dot omission pixels PXL of the original image 320 is high ink duty at Nsum≥T2=9 (ink duty is approximately 90% or greater), it is easy for colored streaks of the object to be recorded 400 due to dot omission pixels PXL continuous in the scan direction D2 to stand out. In light of that, by making at least a portion of the dots DT formed in the primary neighboring pixels PX1 and PX2 adjacent to the dot omission pixels PXL larger, it is difficult for the dot omission area AL streaks to stand out. However, as with the case when 7≤Nsum≤8 (ink duty approximately 70 to 80%), when the dots formed in the secondary neighboring pixels PX3 and PX4 are culled or made to be smaller dots, there are cases when insufficient supplementation, which is insufficient supplementation of dots, occurs. By the size of the dots formed in the secondary neighboring pixels PX3 and PX4 being maintained, this kind of insufficient supplementation is suppressed. For example, in the case of correlations 841 and 842, the "M" of "RN1" and "RN2" is replaced with "L" supplementation dots. In the case of correlations 843 and 844, the "0" of "RN1" and "RN2" is replaced with "L" supplementation dots. For "RN3" and "RN4," the dot arrangement does not change before and after supplementation.

Following, referring to FIG. 17, we will describe the operation and effect of the image forming device 1. FIG. 17 shows an example of dot supplementation for the original image 320 which is high ink duty at Nsum T2=9, for each designated range A101 to A108. For example, for the designated range A101, by the pattern table TBL7 being referenced, large dots are arranged and formed as supplementation dots in the number 3 pixel which is the primary neighboring pixel PX2 of the second area A2 according to "LM" corresponding to "LN" being "MM" and "RN1" being "MM." Also, large dots are arranged and formed as supplementation dots also in the number 7 pixel which is the primary neighboring pixel PX2 of the second area according to "LM" corresponding to "LN" being "MM" and "RN2" being "MM." These large dots are supplementation dots changed from medium dots. For the secondary neighboring pixels PX3 and PX4, the dot arrangement does not change before and after supplementation. For the designated range A103, by the pattern table TBL7 being referenced, new large dots are arranged and formed as supplementation dots at the number 7 pixel which is the primary neighboring pixel PX2 of the second area according to "LM" corresponding to "LN" being "MM" and "RN2" being "0M." For the secondary neighboring pixels PX3 and PX4, the dot arrangement does not change before and after supplementation. For the designated range A104, by the pattern table TBL7 being referenced, large dots are arranged and formed as supplementation dots in the number 3 pixel which is the primary neighboring pixel PX1 of the first area A1, and new medium dots are arranged and formed in the number 4 pixel according to "LM corresponding to "LN" being "MM" and "RN2" being "M0." For the secondary neighboring pixels PX3 and PX4, the dot arrangement does not change before and after supplementation.

With this technology shown as an example in FIG. 17, when the number Nsum of dots to be formed within the designated range A10 is the second designated number T2 or greater, large dots are formed at least at a portion of the primary neighboring pixels PX1 and PX2, and the dot arrangement of the secondary neighboring pixels PX3 and PX4 is maintained. Therefore, it is difficult for the streaks of the dot omission area AL to stand out, and insufficient supplementation such as dot supplementation being insufficient is suppressed, so the image quality of the output image 330 is improved.

(3-7) Summary of Dot Pattern Determination Processing:

As described above, the dot pattern P1 after supplementation formed on the neighboring pixels PXR within the designated range A10 is determined based on at least the number Nsum of dots to be formed in the pixels PX within the designated range A10. Therefore, dots by the defective nozzles LN are more suitably supplemented. Also, by determining the dot pattern P1 being based on at least the dot count Nsum and on the dot count Nln to be formed on the dot omission pixels PXL within the designated range A10, the dot count Nln by the defective nozzles LN is reflected in the dot pattern P1 after supplementation, so dots by the defective nozzles LN are even more suitably supplemented. Furthermore, by the dot pattern P1 being determined based on at least the dot count Nsum, the dot count N1 formed on the first area A1, and the dot count N2 formed on the second area A2, the respective dot counts N1 and N2 of the areas A1 and A2 in the vicinity of the dot omission area AL are reflected in the dot pattern P1 after supplementation, so dots by the defective nozzles LN are even more suitably supplemented.

(4) Modification Examples:

Various modification examples are possible for the present invention.

For example, the image forming device to which this technology can be applied is not limited to being an inkjet printer, and in addition to line printers also includes serial printers, copiers, fax machines and the like.

The ink colors can omit a portion of CMYK, and in addition to CMYK as well, can also include at least a portion of lc (light cyan), lm (light magenta), dy (dark yellow), lk (light black), Or (orange), Gr (green), B (blue), V (violet), and the like.

The nozzles that form the dots on the primary neighboring pixels (adjacent pixels) can also be nozzles other than adjacent nozzles that are adjacent to the defective nozzle in the nozzle alignment direction. For example, with a serial printer, a possibility is a case of forming dots on the primary neighboring pixels using a nozzle separated from the defective nozzle with a different pass (scan) of the recording head using technology such as a microweave or the like.

The processes described above can be changed as appropriate such as by changing the sequence or the like. For example, with the low ink volume process in FIG. 9, the processes of S306 to S308 can also be performed before the processes of S302 to S304.

For each pattern table TBLi, when "LN" is "00," it is possible to stipulate correlations of the neighboring pixels PXR before and after supplementation (correlations for which the dot arrangement does not change, for example). In this case, it is possible to omit the judgment process of S204 in FIG. 8.

When the recording data 300 before supplementation is 4-value data, the supplementation process is performed recording the large dots and the small dots expressed by the recording data 300 as medium dots, and the respective original large, medium and small dots can be arranged in areas for which the dot arrangement does not change before and after supplementation.

The pattern tables TBL1 and TBL2 can also have correlations for which all the dots supplemented are arranged in the second area A2 when "LN" is "MM" for which the dots are continuous.

Figure 18A:
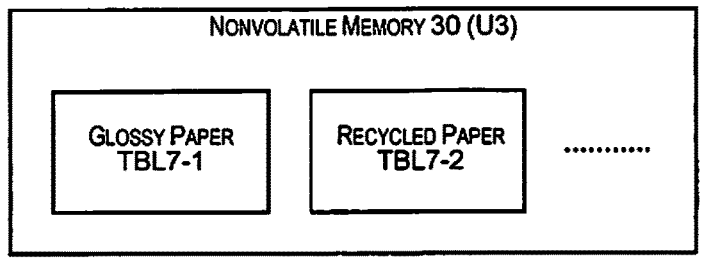
FIG. 18A is a drawing schematically showing an example of providing pattern tables TBLi according to the type of object to be recorded.

As shown by example in FIG. 18A, for each type of object to be recorded or the like, the pattern tables TBLi can be provided according to the type of object to be recorded 400 so as to have dot arrangements according to the type of object to be recorded. In the nonvolatile memory 30 shown in FIG. 18A, as the high ink volume pattern table TBL7 used when Nsum≥T2=9 (ink duty is approximately 90% or greater), shown is storing of a pattern table TBL7-1 for glossy paper (first object to be recorded 401 for which bleeding does not occur easily), a pattern table TBL7-2 for recycled paper (second object to be recorded 402 for which bleeding occurs easily) and the like.

Figure 18B:
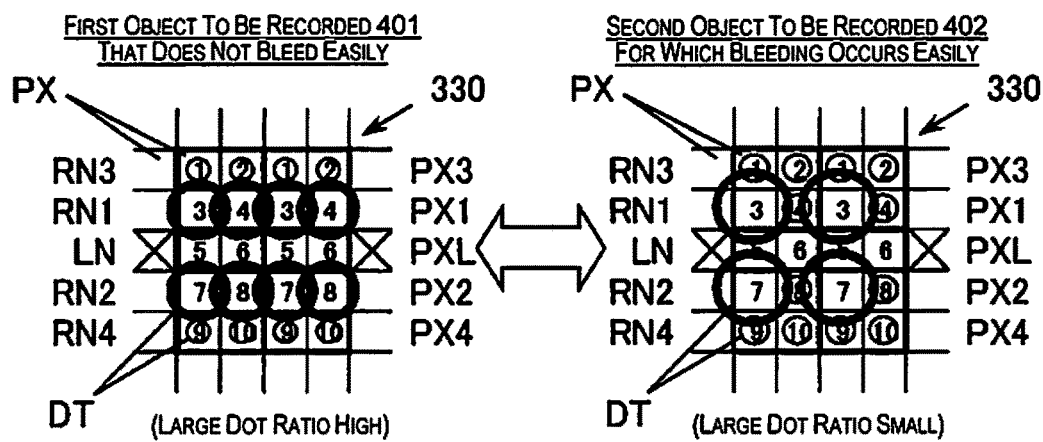
FIG. 18B is a drawing schematically showing an example of changing the large dot generating ratio according to the type of object to be recorded.

FIG. 18B shows an example of the state of the dots DT to be formed on the objects to be recorded 401 and 402. The level of how hard or easy it is for the ink to bleed can be expressed by the size of the ratio of the surface area of the dots DT in relation to the surface area of the pixels PX. In this case, the object to be recorded becomes an object to be recorded for which the smaller the surface area ratio the harder it is for the ink to bleed, and an object to be recorded for which the larger the surface area ratio the easier it is for the ink to bleed. The difficulty or ease of bleeding of the ink depends on the material of the object to be recorded, and for example with regular paper, there is regular paper for which the ink can bleed easily and there is also regular paper for which the ink does not bleed easily.

In the case of a first object to be recorded 400 for which ink does not bleed easily such as glossy paper or the like, whether medium dots are set or large dots are set, the dots are smaller than the dots formed on the second object to be recorded 402 for which ink bleeds easily such as recycled paper or the like. Because of that, when the first object to be recorded 400 is used, the dot omission area AL streaks stand out easily. In light of that, by making the ratio of enlarging dots DT formed in the neighboring pixel PXR within the designated range A10 when using the first object to be recorded 401 larger than the ratio of enlarging dots DT formed in the neighboring pixel PXR within the designated range A10 when using the second object to be recorded 402, the dot omission area AL streaks when using the first object to be recorded 401 do not stand out easily.

Figure 19:
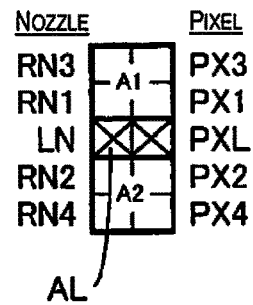
FIG. 19 is a drawing schematically showing an example of the structure of a high ink volume pattern table TBL7-1.

FIG. 19 schematically shows an example of the structure of the pattern table TBL7-1 for glossy paper that is referenced when Nsum≥9. The pattern table TBL7-2 for recycled paper is the same as the pattern table TBL7 for high ink volume shown in FIG. 14. As shown in FIG. 19, the pattern table TBL7-1 for glossy paper has the ratio for enlarging dots DT increased compared to the pattern table TBL7-2 for recycled paper.

As a prerequisite for performing the printing process shown in FIGS. 7 to 9, it is possible for the operating panel 73 controlled by the controller 10 to receive one of the printing modes from among a plurality of printing modes (settings) including a first printing mode (first setting) that forms dots on the first object to be recorded 401, and a second printing mode (second setting) for forming dots on the second object to be recorded 402. The controller 10 stores the information expressing the printing mode received by the operating panel 73 in the RAM 20, for example.

With the high ink volume process (part two) of S218 in FIG. 8, the controller 10 reads the information expressing the printing mode from the RAM 20, for example, and references the pattern table for the object to be recorded used with the printing mode expressed by this information. If the printing mode is a mode that uses the glossy paper for which bleeding does not occur easily (first object to be recorded 401), the controller 10 determines the dot pattern P1 according to the correlation stipulated in the pattern table TBL7-1 for glossy paper such as shown in FIG. 19. In this case, as shown with the example in FIG. 18B, the ratio for randomly forming large dots on the primary neighboring pixels PX1 and PX2, specifically, the ratio for making larger the dots formed on the neighboring pixels PXR within the designated range A10 is made relatively larger compared to when using recycled paper. If the printing mode is the mode used for recycled paper (second object to be recorded 402) for which bleeding occurs easily, the controller 10 determines the dot pattern P1 according to the correlation stipulated in the pattern table TBL7-2 for recycled paper (see FIG. 14). In this case, as with the example shown in FIG. 18B, the ratio for randomly forming large dots on the primary neighboring pixels PX1 and PX2, specifically, the ratio for making larger the dots formed on the neighboring pixels PXR within the designated range A10 is made relatively smaller compared to when using glossy paper.

From the above, when using the first object to be recorded 401 for which bleeding does not occur easily which has a tendency for streaks of the dot omission area AL to stand out easily, a relatively large amount of the large dots are formed on the primary neighboring pixels PX1 and PX2, and the dot omission area AL streaks do not stand out easily. When using the second object to be recorded 402 which has a tendency for the dot omission area AL streaks to not stand out easily, the large dots formed on the primary neighboring pixels PX1 and PX2 are relatively small, the ink (liquid) usage volume is reduced, and the image quality of the output image 330 is improved. Therefore, this modification example can more suitably supplement the dots by the defective nozzles LN according to the difficulty of bleeding or the ease of bleeding of the liquid in the object to be recorded.

For the processes of S208, S212, and S216 as well, it is also possible to determine the dot pattern P1 using the pattern table TBLi according to the type of object to be recorded.

Figure 18C:
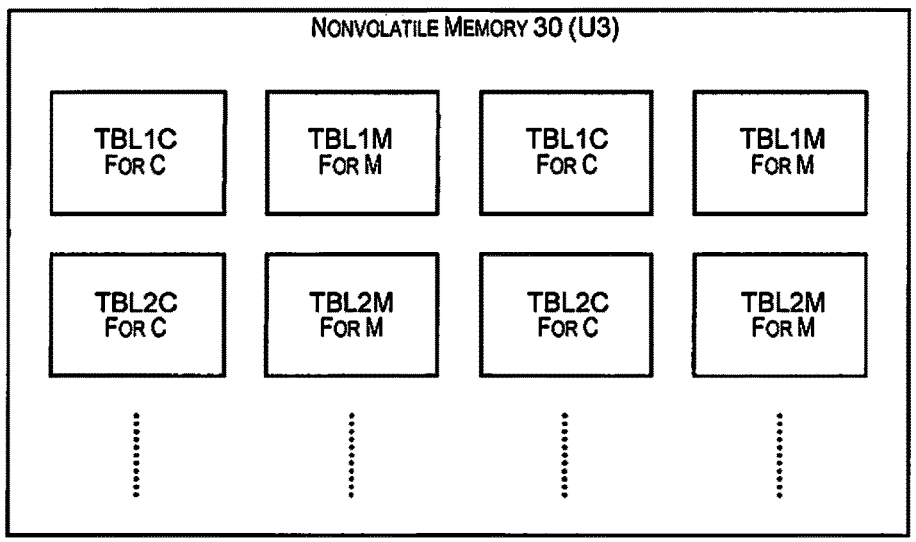
FIG. 18C is a drawing schematically showing an example of providing pattern tables TBLi according to the ink color.

Also, as shown with the example in FIG. 18C, the pattern tables TBLi can also be provided according to the ink color so that the dot arrangement is according to the color of the ink (liquid). In the nonvolatile memory 30 shown in FIG. 18C, shown are the pattern tables TBL1, TBL2, TBL3, TBL4, TBL6, and TBL7 described above having the pattern tables stored divided respectively into CMYK. With the example in FIG. 18C, as the low ink volume pattern table TBL1, shown is the provision of the pattern table TBL1C for dot supplementation of the cyan recording data 300, the pattern table TBL1M for dot supplementation of the magenta recording data 300, pattern table TBL1Y for dot supplementation of the yellow recording data 300, and pattern table TBL1K for dot supplementation of the black recording data 300. As the low ink volume pattern table TBL2, shown is the provision of pattern tables TBL2C, TBL2M, TBL2Y, and TBL2K. This modification example can do more suitable supplementation of dots by the defective nozzle LN according to the color of the liquid.

Of course, pattern tables by color can also be provided according to the type of object to be recorded for each type of object to be recorded or the like.

Even with the image forming device without the defective nozzle detection unit U5 and the setting receiving unit U4, the basic effects of this technology can be obtained.

(5) Conclusion:

As described above, with the present invention, using various modes, it is possible to provide technology that makes it possible to more suitably supplement dots by the defective nozzles for which dot formation is defective. Of course, even with technology consisting only of the constituent elements of the independent claims without having the constituent elements of the dependent claims, the basic operation and effects described above can be obtained.

Also, it is also possible to implement a constitution for which each constitution disclosed in the embodiments and modification examples described above are mutually exchanged, or the combination is changed, or a constitution for which each constitution of known technology as well as that disclosed in the embodiments and modification examples described above are mutually replaced or the combination is changed. The present invention also includes these constitutions and the like.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only a selected embodiment has been chosen to illustrate the present invention, it will be apparent to those skilled in the art from this disclosure that various changes and modifications can be made herein without departing from the scope of the invention as defined in the appended claims. Furthermore, the foregoing descriptions of the embodiment according to the present invention are provided for illustration only, and not for the purpose of limiting the invention as defined by the appended claims and their equivalents.

What is claimed is:

1. An image forming device in which a plurality of nozzles aligned in a designated alignment direction and an object to be recorded are moved relative to each other in a scan direction different from the alignment direction, wherein
in a case where one of the nozzles is detected as a defective nozzle, a plurality of pixels constituting a formed image includes dot omission pixels continuous in the scan direction by the defective nozzle, and neighboring pixels within a designated distance in the alignment direction from the dot omission pixels, the image forming device comprising:
a pattern determining unit configured to count a total number of dots that are assigned to a predetermined designated range based on pre-supplementation recording data, with the predetermined designated range including the dot omission pixels, primary neighboring pixels of the neighboring pixels that are directly adjacent to the dot omission pixels in the alignment direction and secondary neighboring pixels of the neighboring pixels that are directly adjacent to the primary neighboring pixels in the alignment direction on a side of the primary neighboring pixels opposite to the dot omission pixels, and configured to select one of a plurality of post-supplementation dot patterns based on the total number of dots; and
a pattern forming unit configured to form the post-supplementation dot pattern.

2. A dot pattern determining method for an image forming device in which a plurality of nozzles aligned in a designated alignment direction and an object to be recorded are moved relative to each other in a scan direction different from the alignment direction, wherein
in a case where one of the nozzles is detected as a defective nozzle, a plurality of pixels constituting a formed image includes dot omission pixels continuous in the scan direction by the defective nozzle, and neighboring pixels within a designated distance in the alignment direction from the dot omission pixels, the dot pattern determining method comprising:
counting a total number of dots that are assigned to a predetermined designated range based on pre-supplementation recording data, with the predetermined designated range including the dot omission pixels, primary neighboring pixels of the neighboring pixels that are directly adjacent to the dot omission pixels in the alignment direction and secondary neighboring pixels of the neighboring pixels that are directly adjacent to the primary neighboring pixels in the alignment direction on a side of the primary neighboring pixels opposite to the dot omission pixels; and
selecting one of a plurality of post-supplementation dot patterns based on the total number of dots.

3. An image forming device in which a plurality of nozzles aligned in a designated alignment direction and an object to be recorded are moved relative to each other in a scan direction different from the alignment direction, wherein
in a case where one of the nozzles is detected as a defective nozzle, a plurality of pixels constituting a formed image includes dot omission pixels continuous in the scan direction by the defective nozzle, and neighboring pixels within a designated distance in the alignment direction from the dot omission pixels, the image forming device comprising:
a pattern determining unit configured to determine one of a plurality of post-supplementation dot patterns based on a total number of dots that are assigned to the dot omission pixels and the neighboring pixels within a designated range based on pre-supplementation recording data; and
a pattern forming unit configured to form the post-supplementation dot pattern,
the pattern determining unit being configured to perform a first determination to determine whether the total number of dots that are assigned to the dot omission pixels and the neighboring pixels within the designated range based on the pre-supplementation recording data is a designated number or less, and configured to perform a second determination to determine whether the dots that are assigned to the dot omission pixels based on the pre-supplementation recording data are continuously arranged with respect to each other in the scan direction within the designated range, and
the pattern determining unit being further configured to determine the post-supplementation dot pattern such that all of the supplemented dots are formed on the neighboring pixels in only one of the first area and the second area in a case where the first determination and the second determination satisfy the condition.

4. The image forming device according to claim 1, wherein
the pattern determining unit is configured to determine the post-supplementation dot pattern based on at least the total number of dots that are assigned to the dot omission pixels and the neighboring pixels within the designated range based on the pre-supplementation recording data, and a total number of dots that are assigned to the dot omission pixels within the designated range based on the pre-supplementation recording data.

5. The image forming device according to claim 1, wherein
the pattern determining unit is configured to determine the post-supplementation dot pattern based on at least the total number of dots that are assigned to the dot omission pixels and the neighboring pixels within the designated range based on the pre-supplementation recording data, a number N1 of dots that are assigned to pixels of the first area based on the pre-supplementation recording data, and a number N2 of dots that are assigned to pixels of the second area based on the pre-supplementation recording data.

6. The image forming device according to claim 5, wherein the pattern determining unit, among the first area and the second area, is configured to arrange the supplemented dots in pixels in an area of a larger of the number N1 of dots that are assigned to the pixels of the first area based on the pre-supplementation recording data, and the number N2 of dots that are assigned to the pixels of the second area based on the pre-supplementation recording data.

7. The image forming device according to claim 1, wherein
the size of the designated range in the scan direction is two pixels.

8. The image forming device according to claim 1, wherein
the size of at least one of the first area and the second area in the alignment direction is two pixels.

9. The image forming device according to claim 1, wherein
the post-supplementation dot pattern includes dots for which the size has been changed.

10. The image forming device according to claim 1, further comprising
a pattern storage unit configured to store a plurality of pattern tables in which are housed information expressing the post-supplementation dot pattern,
wherein the pattern tables house information correlating to the total number Nsum of the dots that are assigned to the dot omission pixels and the neighboring pixels within the designated range based on the pre-supplementation recording data, and
the pattern determining unit is configured to determine the post-supplementation dot pattern according to information stored in, among the plurality of pattern tables, the pattern table corresponding to the total number Nsum according to the pre-supplementation recording data.

11. The image forming device according to claim 1, wherein
the pattern determining unit, when the total number of dots that are assigned to the dot omission pixels and the neighboring pixels within the designated range based on the pre-supplementation recording data is a second designated number or greater, is configured to make at least a portion of the dots forming adjacent pixels adjacent to the dot omission pixels among the neighboring pixels within the designated range larger, and is configured to maintain the size of the dots formed on the pixels excluding the adjacent pixels among the neighboring pixels within the designated range.

12. The image forming device according to claim 1, further comprising
a setting receiving unit configured to receive one of a plurality of settings including a first setting for forming dots on a first object to be recorded, and a second setting for forming dots on a second object to be recorded for which liquid bleeds more easily than the first object to be recorded,
wherein the pattern determining unit, when the total number of dots that are assigned to the dot omission pixels and the neighboring pixels within the designated range based on the pre-supplementation recording data is a second designated number or greater, is configured to make the ratio for enlarging the dots that are arranged on the neighboring pixels within the designated range when the first setting is received larger than the ratio for enlarging the dots that are arranged on the neighboring pixels within the designated range when the second setting is received.

13. The image forming device according to claim 1, wherein
the designated number is three.

14. The image forming device according to claim 13, wherein
the designated range includes ten pixels.

15. The image forming device according to claim 1, wherein
the pattern determining unit is further configured to determine whether no dot is assigned to the neighboring pixels in the first area based on the pre-supplementation recording data, and
the pattern determining unit is further configured to determine the post-supplementation dot pattern such that all of the supplemented dots are formed on the neighboring pixels only in the first area in response to determining that no dot is assigned to the neighboring pixels in the first area based on the pre-supplementation recording data, in response to determining that the total number of dots that are assigned to the dot omission pixels and the neighboring pixels within the designated range based on pre-supplementation recording data is the designated number or less, and in response to determining that the dots that are assigned to the dot omission pixels based on the pre-supplementation recording data are continuously arranged with respect to each other in the scan direction within the designated range.

16. The image forming device according to claim 15, wherein
the pattern determining unit is further configured to determine the post-supplementation dot pattern such that all of the supplemented dots are formed on adjacent pixels adjacent to the dot omission pixels among the neighboring pixels in the first area in response to determining that no dot is assigned to the neighboring pixels in the first area based on the pre-supplementation recording data, in response to determining that the total number of dots that are assigned to the dot omission pixels and the neighboring pixels within the designated range based on pre-supplementation recording data is the designated number or less, and in response to determining that the dots that are assigned to the dot omission pixels based on the pre-supplementation recording data are continuously arranged with respect to each other in the scan direction within the designated range.

* * * * *

UNITED STATES PATENT AND TRADEMARK OFFICE
CERTIFICATE OF CORRECTION

PATENT NO. : 10,241,414 B2
APPLICATION NO. : 15/876536
DATED : March 26, 2019
INVENTOR(S) : Akito Sato et al.

Page 1 of 1

It is certified that error appears in the above-identified patent and that said Letters Patent is hereby corrected as shown below:

On the Title Page

Item [30], insert:
--[30] Foreign Application Priority Data
Feb. 3, 2014 (JP).......................2014-018299--

Signed and Sealed this
Twenty-eighth Day of May, 2019

Andrei Iancu
*Director of the United States Patent and Trademark Office*